US009617834B1

(12) United States Patent
Venter et al.

(10) Patent No.: US 9,617,834 B1
(45) Date of Patent: **\*Apr. 11, 2017**

(54) PRESCRIPTIVE RESERVOIR ASSET MANAGEMENT

(71) Applicant: DATAINFOCOM USA, INC., Austin, TX (US)

(72) Inventors: Frederick Johannes Venter, Driftwood, TX (US); Atanu Basu, Austin, TX (US)

(73) Assignee: DATAINFOCOM USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/500,977

(22) Filed: Sep. 29, 2014

Related U.S. Application Data

(63) Continuation of application No. 14/467,601, filed on Aug. 25, 2014.

(60) Provisional application No. 61/869,892, filed on Aug. 26, 2013.

(51) Int. Cl.
| | |
|---|---|
| G06K 9/00 | (2006.01) |
| E21B 43/00 | (2006.01) |
| G01V 8/00 | (2006.01) |
| E21B 47/10 | (2012.01) |
| G06F 7/00 | (2006.01) |

(52) U.S. Cl.
CPC ............ *E21B 43/00* (2013.01); *E21B 47/102* (2013.01); *G01V 8/00* (2013.01); *G06K 9/0063* (2013.01)

(58) Field of Classification Search
CPC ............. G06K 9/00; E21B 43/00; G01V 3/00
USPC .... 382/100, 109; 705/7.26, 7.31, 7.38, 7.39; 706/47, 59, 60; 707/634, 636, 821
See application file for complete search history.

(56) References Cited

U.S. PATENT DOCUMENTS

| | | | |
|---|---|---|---|
| 6,876,988 | B2 | 4/2005 | Helsper et al. |
| 6,917,928 | B1 * | 7/2005 | Pellinat .................. G06Q 10/10 706/59 |
| 7,373,633 | B2 * | 5/2008 | Kraiss ..................... G06F 9/445 707/999.101 |
| 7,979,380 | B2 | 7/2011 | Moyne et al. |
| 8,200,527 | B1 | 6/2012 | Thompson et al. |
| 8,209,218 | B1 * | 6/2012 | Basu .................. G06Q 10/0637 705/7.36 |
| 8,209,275 | B2 | 6/2012 | Tsui et al. |
| 8,364,519 | B1 | 1/2013 | Basu et al. |
| 8,738,425 | B1 | 5/2014 | Basu et al. |
| 9,057,256 | B2 * | 6/2015 | Ige ........................ E21B 43/128 |
| 2001/0034628 | A1 | 10/2001 | Eder |
| 2002/0006192 | A1 | 1/2002 | Bengtson et al. |
| 2002/0049621 | A1 | 4/2002 | Bruce |

(Continued)

OTHER PUBLICATIONS

"Altaworks Selected by Industry Influencers to Demonstrate at DEMO 2002 Conference"; Business/Technology Editors; Business Wire; New York; Jan. 16, 2002; p. 1; Proquest.

(Continued)

*Primary Examiner* — Abolfazl Tabatabai

(57) ABSTRACT

A method of projection a production characteristic includes receiving down well video image data depicting multiphase flow within the well, determining a flow rate data of at least one phase of the multiphase flow based on the down well video image data, and projecting the production characteristic based at least in part on the determined flow rate using a well performance model.

16 Claims, 12 Drawing Sheets

(56) References Cited

U.S. PATENT DOCUMENTS

| | | |
|---|---|---|
| 2002/0049687 A1 | 4/2002 | Helsper et al. |
| 2003/0177060 A1 | 9/2003 | Seagraves |
| 2004/0068429 A1 | 4/2004 | MacDonald |
| 2004/0068431 A1 | 4/2004 | Smith et al. |
| 2004/0148047 A1 | 7/2004 | Dismukes et al. |
| 2005/0004834 A1 | 1/2005 | Smith |
| 2006/0010164 A1 | 1/2006 | Netz et al. |
| 2006/0101017 A1 | 5/2006 | Eder |
| 2006/0229921 A1 | 10/2006 | Colbeck |
| 2006/0242033 A1 | 10/2006 | Corbett |
| 2006/0242035 A1 | 10/2006 | Corbett et al. |
| 2007/0106593 A1 | 5/2007 | Lin |
| 2007/0129893 A1 | 6/2007 | McColl et al. |
| 2007/0150324 A1 | 6/2007 | Makita et al. |
| 2008/0004922 A1 | 1/2008 | Eder |
| 2008/0027769 A1 | 1/2008 | Eder |
| 2008/0104104 A1 | 5/2008 | Nolan et al. |
| 2008/0140623 A1 | 6/2008 | Tien et al. |
| 2008/0183786 A1 | 7/2008 | Shimizu |
| 2008/0195440 A1 | 8/2008 | Bagchi et al. |
| 2008/0201397 A1 | 8/2008 | Peng et al. |
| 2008/0243912 A1 | 10/2008 | Azvine et al. |
| 2009/0064025 A1 | 3/2009 | Christ et al. |
| 2009/0138334 A1 | 5/2009 | Henby et al. |
| 2009/0171879 A1 | 7/2009 | Bullen et al. |
| 2009/0217183 A1 | 8/2009 | Moyne et al. |
| 2009/0319931 A1 | 12/2009 | Hutchings et al. |
| 2010/0077077 A1 | 3/2010 | Devitt |
| 2010/0114899 A1 | 5/2010 | Guha |
| 2010/0274637 A1 | 10/2010 | Li et al. |
| 2010/0332439 A1 | 12/2010 | Adachi |
| 2011/0071867 A1 | 3/2011 | Chen et al. |
| 2011/0213644 A1 | 9/2011 | Phene |
| 2013/0211746 A1 | 8/2013 | Elshafei et al. |

OTHER PUBLICATIONS

"Fonterra Canpac Deploys Pavilion's Production Performance Management Solution: Fast Moving Consumer Goods Manufacturer Improves Operational Performance and Reduces Waste"; Business Wire; New York; May 23, 2006; p. 1; Proquest.

"Performance—Measurement & Small to Mid-sized Call Center Solutions"; Call Center Solutions; Mar. 1999; 17, 9; ProQuest Central; p. 22.

"Predictive Analysis with SQL Server 2008"; White Paper; Microsoft SQL Server 2008 R2; Nov. 2007.

Bauer; "Predictive Analytics: Data Mining with a Twist"; DM Review 15.12; Dec. 2005; p. 76.

Bauer; "Predictive Analytics: The Next Wave in KPI's"; DM Review; Nov. 2005.

Cheisa et al; "How do measurement objectives influence the R&D performancee measurement system design:"; Management Research News; 30(3); pp. 182-202; doi:10.1108/01409170710733269.

Colias; "New Statistical Tools for Key Driver Analysis"; Decision Analyst; 2007.

Fair Isaac Corp.; Decision Management Tools-Xpress OptiMIzer; Product Sheet; 2008; 2 Pgs.

Fair Isaac Corporation; "Predictive Analytics: Custom Insurance Analytics"; Product Sheet; 2008; 2 pages.

Frangopol et al.; "Probabilitic Performance Prediction of Deteriorating Structures Under Different Maintenance Strategies: Condition, Safety and Cost"; Apr. 2004.

Holland; "Achieving a step change in contact centre performance: Exploiting data to make better decisions and take effective action"; Journal of Targeting, Measurement and Analysis for Marketing, vol. 12, 2, pp. 103-113.

Keeley; "Root Cause Analysis Research Corner Cause and Effect"; Call Center Magazine; Mar. 2005.

Lawson et al; "Socrecards and dashboards—partners in performance"; CMA Management; Dec./Jan. 2007.

Loucks; "Model Sensitivity and Uncertainty Analysis"; Water Resources Planning and Management; UNESCO; 2005; http://ecommons.library.cornell.edu/bitstream/1813/2804/12/09_chapter09.pdf.

Marr; "Measuring and managing intangible value drivers"; Business Strategy Series; 8(3); 2007; pp. 172-178.

Palfreyman;"Performance Indicators and Reporting: Some practical guidelines"; 1998; Charter. 69 (4), pp. 85-86.

SAS Institute Inc., "How to Compete on Analytics: The Analyitical Center for Excellence"; White Paper; 2008; 18 pages.

SAS Institute Inc., Ngenera Corporation, and Intel; "Sucessful Automating Decisions with Business Analytics: How to Identify High-Value Opportunities for Embedding Analytics into Your Business Processes"; White Paper; 2008; 22 pages.

SAS Institute Inc.; Enhancing Sales and Operations Planning with Forecasting; White Paper; 2008; 14 pages.

SAS Institute: "Data Driven Decision Making: Analyzing Your Data to Improve Student Learning"; White Paper; 2008; 19 pages.

SAS Institute; "Data Management for Risk: The Importance of Data for Effective Risk Management"; White Paper; 2009; 11 pages.

SAS Institute; "The SAS Enterprise Intelligence Platform: SAS Business Intelligence; Enabling BI Consolidation and Standardization Without Comprises"; White Paper; 2008; 13 pages.

SPSS Inc.; Clementine® 12.0 Specifications; "Achieve Better Insight and Prediction with Data Mining"; Product Specificiations; 2008; 6 pages.

SPSS Inc.; "Get More Out of Your Analyitical Investment"; Advertisement; 2008; 2 pages.

Wen et al.; "Utilizing the Balanced Scorecard for Performance Measurement of Knowledge Management"; Journal of Accounting, Finance & Management Strategy, 3(2), pp. 39-58.

U.S. Appl. No. 14/467,601, Prescriptive Reservoir Asset Management, Frederick Venter, Aug. 25, 2014.

U.S. Appl. No. 14/578,444, Prescriptive Reservoir Asset Management, Frederick Johannes Venter, Dec. 21, 2014.

U.S. Appl. No. 14/578,445, Prescriptive Reservoir Asset Management, Frederick Johannes Venter, Dec. 21, 2014.

* cited by examiner

US 9,617,834 B1

PRESCRIPTIVE RESERVOIR ASSET MANAGEMENT

CROSS REFERENCE TO RELATED APPLICATION

This application is a continuation of U.S. patent application Ser. No. 14/467,601, filed on 25 Aug. 2014 and having the same title, which claims benefit of U.S. Provisional Patent Application No. 61/869,892, filed on 26 Aug. 2013 and having the same title, each of which is incorporated herein by reference.

FIELD OF THE DISCLOSURE

This disclosure, in general, relates to systems and methods for prescriptive reservoir asset management.

BACKGROUND

An expanding global economy has yielded ever-increasing demand for energy. In particular, demand for hydrocarbon fuel sources is growing, as are prices for oil and natural gas. As such, there is an increased interest in finding new sources of hydrocarbons, and an increased drive to improve production from existing hydrocarbon reservoirs.

Recent changes in technology led to drilling in previously inaccessible reservoir structures. In particular, oil and gas shale formations, previously considered unproductive, are now being tapped for hydrocarbon production. Management of production within such structures tends to be more challenging than typical production structures. Such challenges can lead to an increased cost of production and difficulties in predicting production levels.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In a particular example, flow rate and compositional data of a multiphase flow is used to project production characteristics of a well or reservoir. In particular, flow and compositional data can be both time-dependent and position-dependent within the well. In an example, such flow and compositional data can be gleaned from an unstructured data source, such as video image data captured down well. The flow and compositional data can be used to build models relating production characteristics to flow and compositional data for individual well assets and for reservoir or field level production characteristics.

Figure 1:
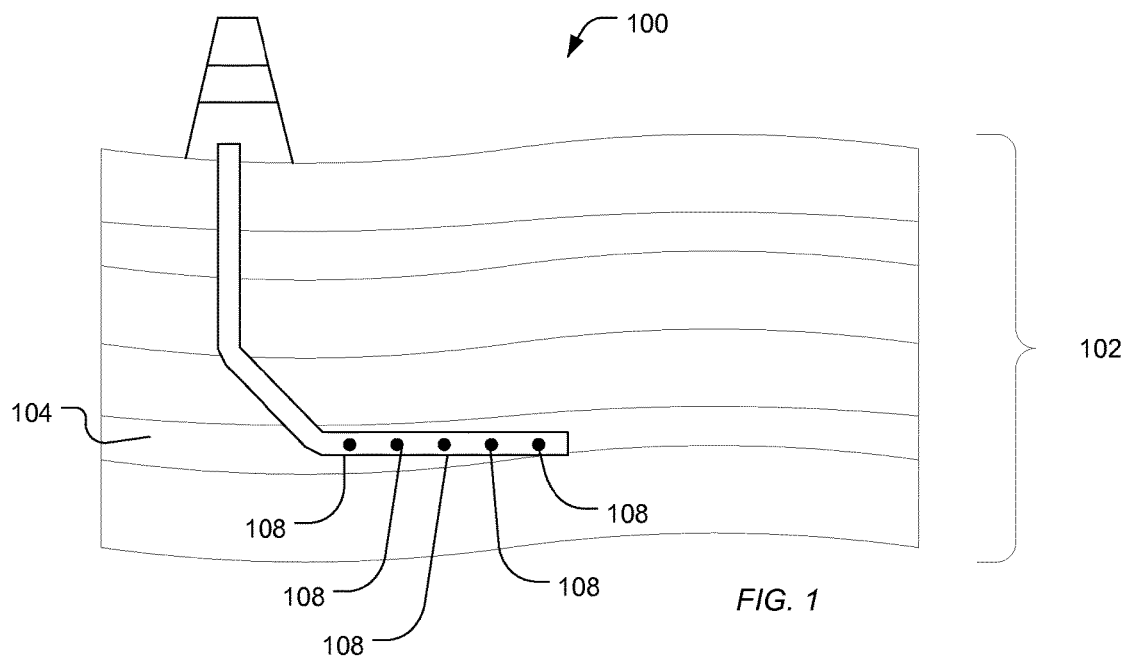
FIG. 1 includes an illustration of an exemplary well to access a production structure.

In an example, FIG. 1 illustrates an exemplary series of rock strata 102 including a productive structure 104 that holds desirable production fluids, such as hydrocarbon oil or gas. The well 106 is drilled through the strata formations 102 and into the productive structure 104. In particular, the well 106 is illustrated as having production points 108. Such production points 108 are typically perforations within a wall of the well 106 providing fluidic access from the productive structure 104 to the well bore of the well 106. Such perforations 108 generally result in the production of a multiphase flow from the productive structure 104 through the perforations 108 and up a well 106. As illustrated, the well 106 utilizes horizontal drilling. However, several techniques can be used to provide multiple production points 108 within a productive structure 104.

In particular, flow data associated with a phase of the multiphase flow can be determined in proximity to one or more of the perforations 108. Such data can be utilized to build a model associated with the well, project a production characteristic associated with well, or prescribe treatment or processing of the well.

Figure 2:
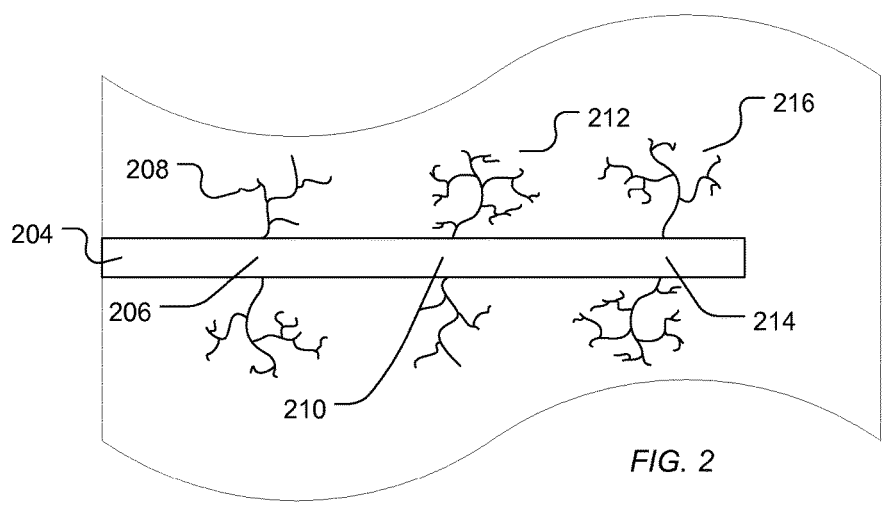
FIG. 2 illustrates an exemplary well bore within a production structure.

As illustrated in FIG. 2, a productive structure 202 includes a well bore 204. At perforation locations (206, 210, or 214), the well can be treated to facilitate fracturing (208, 212, or 216) within the productive structure 202, termed "finking." Such fracturing generally increases flow rates through the perforations. However, owing to variability within a structure and different phases of material residing within the structure, different compositional flow rates may result at each of the positions (206, 210 or 214). In an example, flowing compositional data can be determined at one or more of the positions. Such data can be utilized to build models relating production characteristics to the measured flow data. Such models can be utilized to project production within a particular well, prescribe treatment for the well, or in aggregate, be used to model, project, and strategically plan production from a reservoir or field.

In particular, an unstructured data source, such as video image data of multiphase flow taken at one or more positions within a well bore, can be used to determine flow rate data of one or more phases of the multiphase flow. Such flow rate data can include average compositional data expressed as volume percent of flow or weight percent of flow, average flow velocity of one or more of the phases of the multiphase flow, or a combination thereof.

Figure 3:
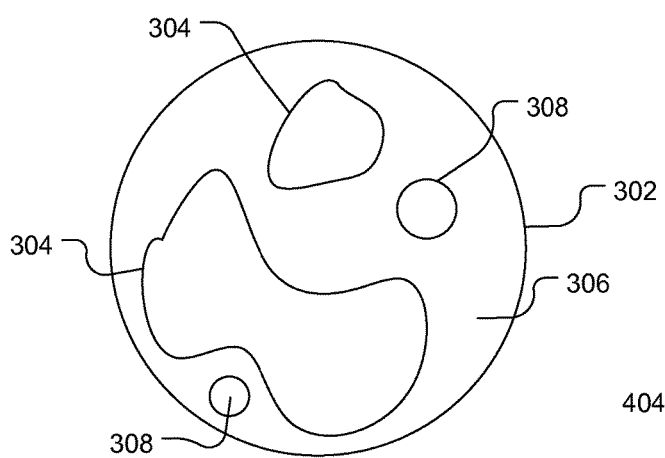
FIG. 3, FIG. 4, and FIG. 5 include illustrations of exemplary multiphase flow within a well bore.
Figure 4:
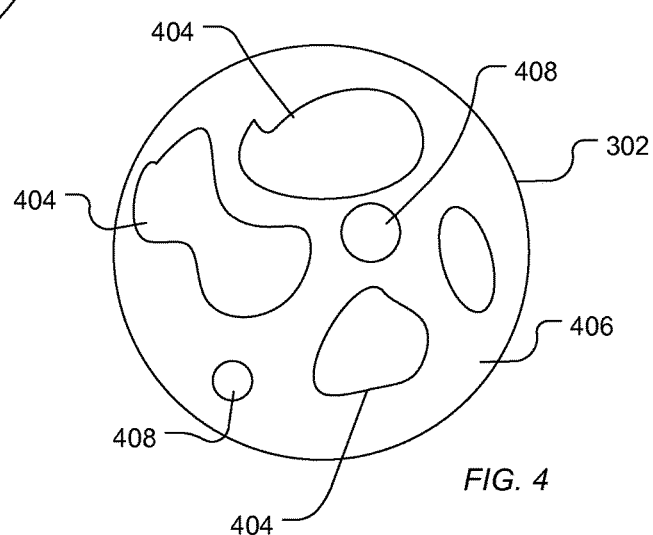

In an example, illustrated in FIG. 3, video image data can be analyzed to identify phases within a multiphase flow. For example, FIG. 3 illustrates flow within a well bore 302. Flow includes for example, an oil phase 304 within an aqueous phase 306. The multiphase flow may also include a gas phase 308. FIG. 4 illustrates the multiphase flow in the same position within the well bore 302. The phases (oil phase 404, aqueous phase 406, or gas phase 408) change in confirmation with time either within the same video image data taken over a short period of time, such as minutes or hours, or video image data taken at different times at the same position, such as days, weeks, or months apart. In particular, an image file or video image data taken over a short period of time can be analyzed to determine an average flow rate of a particular phase, such as an oil phase or a gas phase within a multiphase flow.

Figure 5:
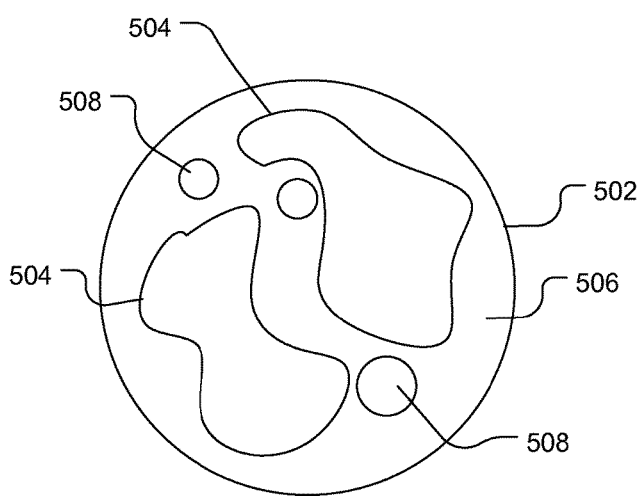

At a different position, as illustrated in FIG. 5, of a well bore 502, the multiphase flow can have a different compositional configuration as determined by identifying the phases (oil phase 504, aqueous phase 506, or gas phase 508) within the video image data. As such, the video image data can be utilized to determine position-based compositional and flow rate variations or to determine flow rate data at different times. Such flow rate data can be used to build models relating production characteristics to the identified flow rate data. Production characteristics can include expected total production of one or more of the phases, changes in production rates over time, positional variability of production rates, the response of production rates to well treatment or to further processing of the well.

In a particular example, the system can identify phases of a multiphase flow and associate a cross-sectional area with a phase of the multiphase flow in one or more frames. The system can average the cross-sectional area across multiple frames to determine a composition. In an example, the frames can be consecutive frames of a video. In another example, the frames can be selected periodically or randomly from a segment of video. Using a total flow rate and the estimated composition, a flow rate of a phase can be determined.

Figure 6:
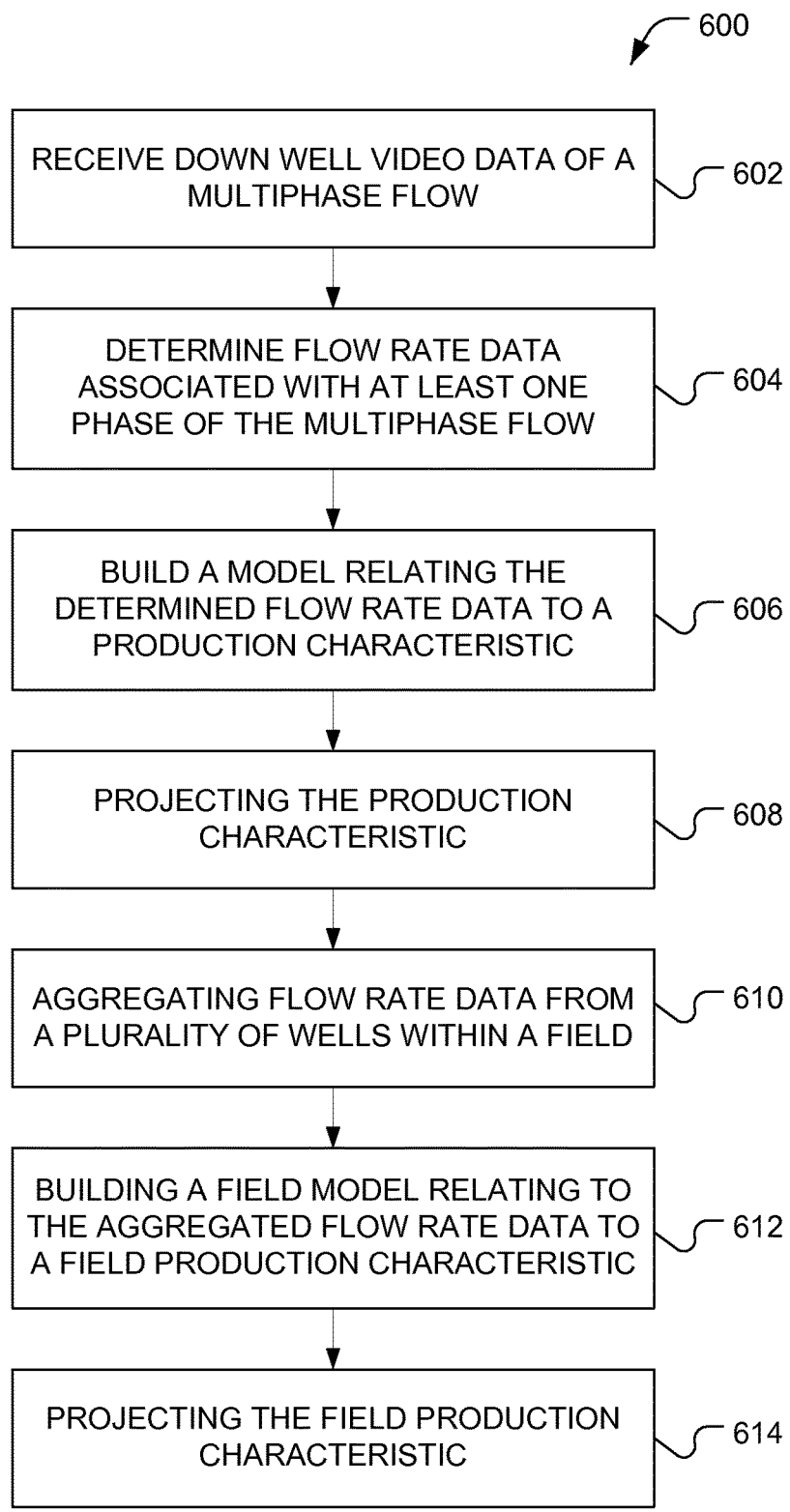
FIG. 6 includes a flow diagram illustrating an exemplary method for managing production of reservoir assets.

FIG. 6 includes an illustration of exemplary method 600 for managing a productive asset. As illustrated at 602, down well video image data of a multiphase flow is received. Such video image data can be in various formats including MPEG formats, MOV formats, NTSC, PAL, or various other video formats. Non-digital formats can be converted to digital formats for analysis.

As illustrated at 604, flow rate data can be determined for at least one phase of the multiphase flow. In an example, phases within the video image data can be identified. Techniques for identifying phases can, for example, rely on identifying boundaries of the phases. Exemplary algorithms include edge detection, feature extraction based on intensity, texture, image flow, machine learning based on scalable vector machines.

In an example, the area associated with a particular phase can be determined and averaged over time to determine compositional characteristics of the multiphase flow and thus, determine flow rate data associated with a phase of the multiphase flow. Composition or flow rate can be estimated across multiple frames of video, for example, selected consecutively or periodically.

A model relating the determined flow rate data to the production characteristics can be built, as illustrated at 606.

In particular, additional data, such as data associated with well completion, perforation formation, number of perforations, well treatment, characteristics of the structural production formation, such as composition or porosity, among other features, or any combination thereof, can be used along with the flow rate data to build a model associating a production characteristic to the flow rate data.

In particular, such a model can be used to project a production characteristic of a well, as illustrated at 608. For example, the production characteristic can be an expected production rate of a particular phase, such as a hydrocarbon phase. In another example, the production characteristic can be the production of the phase as it is projected to vary over time. In a further example, the projected production characteristic may be a projection of production changes in response to further treatment of the well, such as finking, hot oil treatment, or other treatments associated with production in a well. In an additional example, projecting the production characteristic can include projecting a change in production in response to additional processing of the well, such as adding or eliminating perforations, reworking the well to change positioning of perforations or other processing or reworking of a well.

As illustrated at 610, the flow rate data can be aggregated from a plurality of wells within a field or reservoir. Such aggregated flow rate data can be used to build additional models relating flow rate data to single well production characteristics. Alternatively, as illustrated at 612, such aggregated flow rate data can be used to build a field reservoir model relating the aggregated flow rate data to a field production characteristic. Exemplary field production characteristics include current production rates, projected future production rates, projected changes in production rates, changes in production rates in response to additional drilling, processing or treating of wells, the projected lifetime of the reservoir or field, or projections relating to total hydrocarbon recovery, or any combination thereof. In addition, data associated with the number of wells, well completion features, features of the reservoir formation, data from similar formations, or any combination thereof can be used to build the model.

Using the field model, the field production characteristic can be projected, as illustrated at 614. In particular, as additional flow rate data is measured, such flow rate data may be aggregated and used to project current and future production characteristics.

In a particular example, video imaging can be performed at different positions within a well. Data from the video imaging can be analyzed to determine the flow rate data associated with phases as the flow rates change with position within a well. The system can then project the response of a well or the changes in the flow rate of one or more phases to an additional treatment, such as additional fracking. In another example, the system can project the changes in the flow rate in response to reworking the well. For example, the system may project improved production in response to repositioning perforations, changing the number or type of perforations, or blocking perforations. In another example, the production flow rates can be used to build a model characterizing the response of a particular production structure to parameters associated with a well treatment, such as fracking. Fracking treatments can involve parameter, such as pressure, fluid pH, surfactants, grain size, concentration, and type, duration, among others, or any combination thereof. As wells are treated within the formation, the model may project which treatment alternatives and parameters to use to improve production from a given well within a particular formation.

In particular, a computer system, such as a user-interactive computer system, or a non-transitory storage media can implement aspects of the above methods. In an example, a method that includes generating an instance from an unstructured data source, such as down well video. The method further includes associating a variable entity with the instance, determining a value of the variable entity from the instance based on a value detection rule, and generating a model. In an example, the variable entity can be associated with an influencer of a set of influencers. In another example, the variable entity can be associated with a performance indicator of a set of performance indicators. A model can associate the set of influencers with the set of performance indicators and can be generated using the value of the variable entity. Exemplary unstructured data sources include video data, image data, audio data, narrative text, or any combination thereof. The method can further include associating a time stamp with the value of the variable entity based on a time detection rule. Generating the model can further include generating the model using the value of the variable entity associated with the time stamp.

In particular, instances can be generated from an instance extractor formed based on a set of heuristics provided by user or determined based on a generated model. In an example, unstructured data annotated with associated instances can be provided to the system. The system can generate an instance extractor utilizing a subset of the annotated unstructured data provided to the system. The system can further test the instance extractor using a different subset of the annotated unstructured data. The process can be repeated using different subsets for calibrating and testing. Subsets can be manually assigned. In another example, subsets can be randomly selected by the system.

A variable entity detector, a value detector and a timestamp detector can be generated from a plurality of annotated instances. A set of instances annotated with or associated with structured data can be provided to the system. The system can use the annotated instances to generate one or more models, such as a variable entity detector, a value detector, or a timestamp detector. Models can be tested using a second subset of the set of annotated instances. The process can be repeated, training the models using further subsets of the annotated instances and testing using different further subsets of annotated instances. Once the models are established, such as the variable entity detector, the value detector, or the timestamp detector, structured data can be generated using such models from instances generated by an instance extractor.

Figure 7:
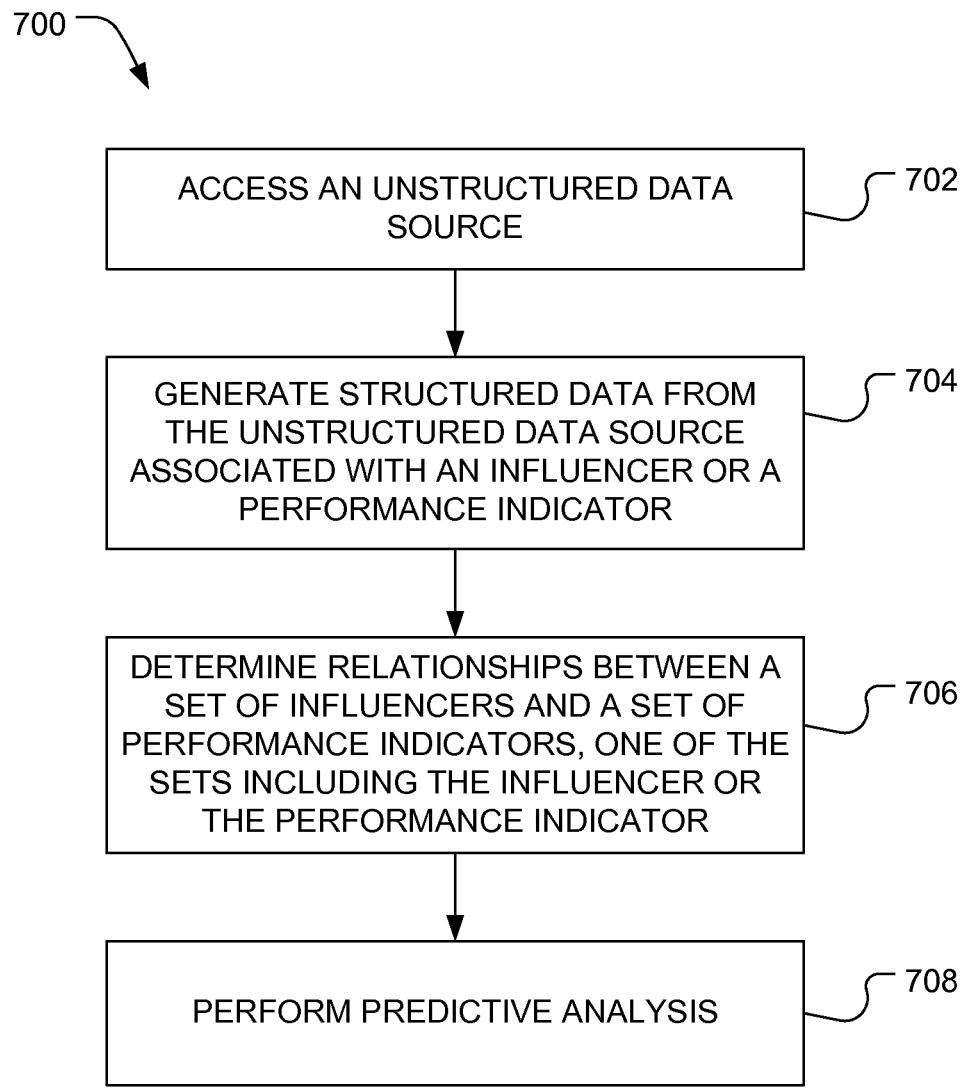
FIG. 7 includes a flow diagram illustrating an exemplary method for performing predictive analysis.

In an example, FIG. 7 illustrates an exemplary method 700 for performing predictive analysis using unstructured data. The method includes accessing an unstructured data source, as illustrated at 702, generating structured data from the unstructured data source, as illustrated at 704, determining the relationships between a set of influencers and a set of performance indicators based on the structured data, as illustrated at 706, and performing predictive analysis, as illustrated at 708.

As illustrated at 702, an unstructured data source can be accessed. An exemplary unstructured data source includes a video data source, an image data source, an audio data source, narrative text, or any combination thereof. A structured data source has a relational structure in which identified variables are associated with a set of machine-readable values. An exemplary machine-readable value includes numerical values, integer values, categories, Boolean values, or combinations thereof, among others. The values within the set of machine-readable values may be associated with a time stamp. As such, the association between variables and values in the structured data source is relatively simple, and not complex. In contrast, an unstructured data source utilizes significant processing to associate a value with the variable entity. Further, the variable entity may not be readily identified with the unstructured data source. As such, an unstructured data source may not include an association with a variable entity or a value associated with the variable entity and further may lack a time stamp associated with the value. Processing an unstructured data source can include identifying which variable entity to associate with the data source, determining a value, and optionally extracting a time stamp associated with the value from the unstructured data source.

As illustrated at 704, structured data is generated from the unstructured data source. The variable entity, value, and optionally time stamp are derived from the unstructured data and stored as structured data. The variable entity associated with the structured data can be an influencer of a set of influencers or a performance indicator of a set of performance indicators.

A relationship between the set of influencers and the set of performance indicators is determined based on the structured data including the structured data derived from the unstructured data source, as illustrated at 706. The relationships can take the form of heuristics or the form of algorithms to form regression models, Markov chains, time series models, state space models, Bayesian models, neural networks, or any other appropriate model, or any combination thereof. In particular, exemplary algorithms include autoregressive integrated moving average (ARIMA), seasonal ARIMA (SARIMA), autoregressive conditional heteroskedasticity (ARCH), or generalized autoregressive conditional heteroskedasticity (GARCH), among others.

Using the relationships, predictive analysis can be performed, as illustrated at 708. In particular, the analytics system and methods can be used to implement Prescriptive Analytics® techniques that assist with determining future actions or decisions in view of business rules and projected outcomes. The methods herein can be embodied in executable instructions, processors or systems to execute such instructions, interfaces implemented by such systems, media storing such executable instructions, and services derived from the use of such methods and systems. In addition, the methods can be utilized to provide Predictive Decision Management® information and services, such as Decision-as-a-Service™ services. In particular, the methods can implement predictive analysis, such as forecasting to project what will happen and when. Further, the methods can implement optimization, scenario testing, and root cause analysis of factors that influence performance.

Figure 8:
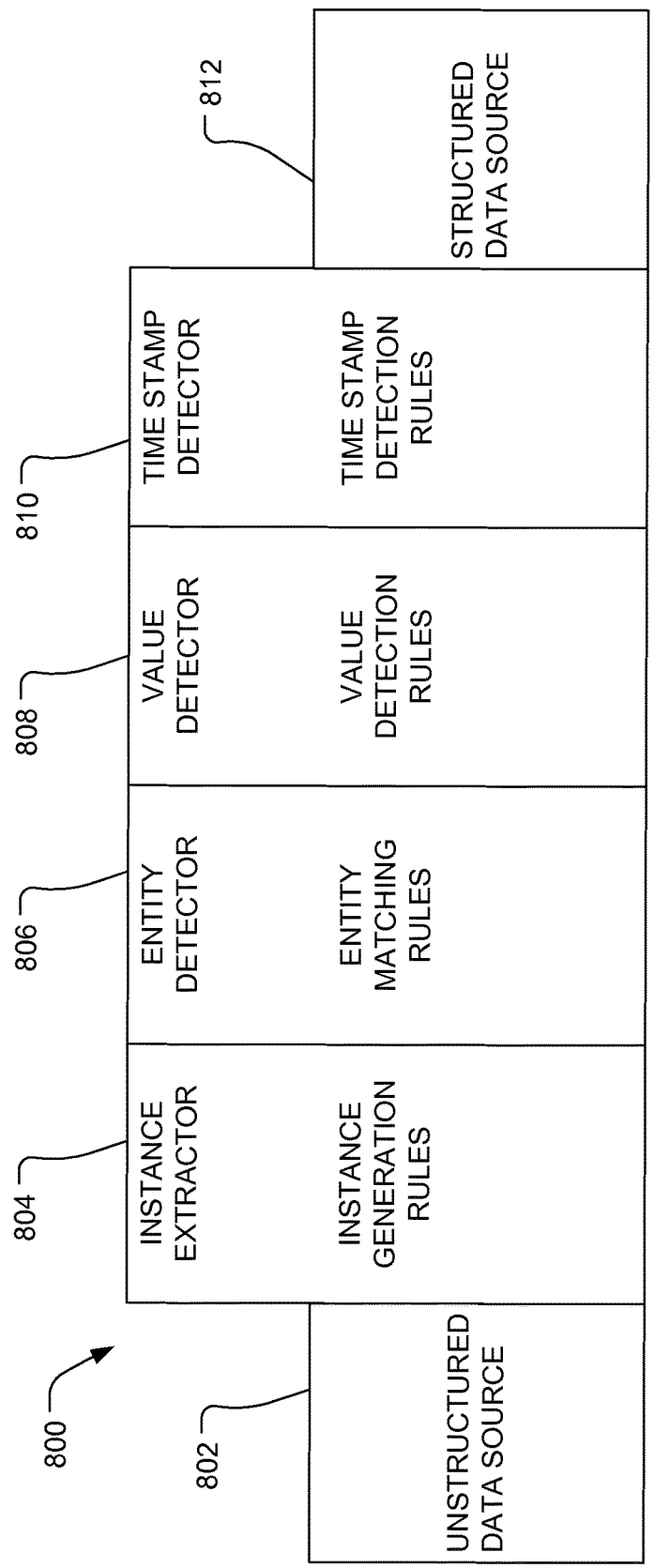
FIG. 8 includes an illustration of an exemplary system for processing unstructured data.

In a particular example, the system for performing predictive analysis includes a subsystem or a separate system for accessing unstructured data and generating structured data from the unstructured data. For example, FIG. 8 includes an illustration of exemplary system 800 for generating structured data from unstructured data. The system 800 accesses the unstructured data source 802 and generates one or more instances from the unstructured data using an instance extractor 804. In particular, the instance extractor 804 can include instance generation rules for generating instances from the unstructured data source 802. An instance represents an atomic piece of data from which a single value of a variable to be associated with the instance can be derived when secondary processing is performed on the instance. A single data point or value and optionally an associated time stamp are derived from the instance, in part depending on the type of variable to be associated with the instance. Exemplary instances can include images, segments of images, segments of video, sentences, paragraphs, phrases, or any combination thereof, among others.

The instance extractor and the instance generation rules can include a set of heuristics or algorithms to be applied based on the form of the unstructured data source. For example, the instance generation rules can include an identified data type and an associated heuristic or algorithm for generating instances from data of the identified type.

In an example, video data can be separated into individual frames and stored as image instances, or an audio track instance can be extracted from a video source. In another example, portions of audio data can be processed to extract human voices or conversations. In a further example, narrative texts can be processed to extract sentences or phrases of interest as instances.

Once the instances are extracted from the unstructured data source 802, one or more instances can be associated with a variable entity or identity using an entity detector 806. For example, the entity detector 806 can include entity matching rules, and the entity matching rules can be used to associate or identify which variables can be associated with the instances. The entity matching rules can include a variable type to be associated with the variable entity and an instance type to which the variable entity can be assigned. In part, the variable type associated with the variable entity detector 806 can influence which instances can be associated with the variable entity. For example, a facial expression type variable can appropriately be associated with frames of a video that include faces as opposed to an audio file extracted from a video source. In another example, a sentiment analysis variable determined based on changes in pitch of voice may be appropriately associated with an audio file extracted from a video source, but would not be appropriate for assignment to instances including images or narrative text.

A value can be extracted from an instance based on the identity or variable type associated with the instance. In particular, the system can include a value detector 808 that includes value detection rules for determining the value from the instance 804. In an example, the value detector 808 can include the nature of the value and an algorithm for extracting value from the instance 804. The nature of the value can be numerical, integer, Boolean, or categorical, among others.

Optionally, a time stamp to be associated with the value can be derived from the instance. For example, a time stamp detector 810 can include time detection rules. The time detection rules can be applied to the instance to determine the time stamp to be associated with the value. An exemplary time detection rule can include an indication of the format of the time stamp and which algorithm to use when deriving the time stamp, among other features. For example, a time stamp can be derived from a file creation date. However, the file creation date is frequently an inaccurate indication of a time stamp, particularly when an image is derived from a frame of video during processing unstructured data 802. As such, the time detection rules may derive time from metadata associated with the original file or the instance or from aspects within an image, for example. In an example, a time stamp may be shown in the image. In a further example, a time of day or season may be generated based on context within the image, such as based on a background within an image. In another example, an audio file may include embedded data indicating a time stamp associated with the audio file or may include a voice stating the time stamp or providing context from which a time stamp can be derived.

As such, processing the unstructured data 802 to form one or more instances can result in an identified variable, a set of values associated with the variable, and optionally times associated with values to be stored as structured data 812. Such structured data 812 can be accessed for performing predictive analysis or other techniques such as Prescriptive Analytics®.

Figure 9:
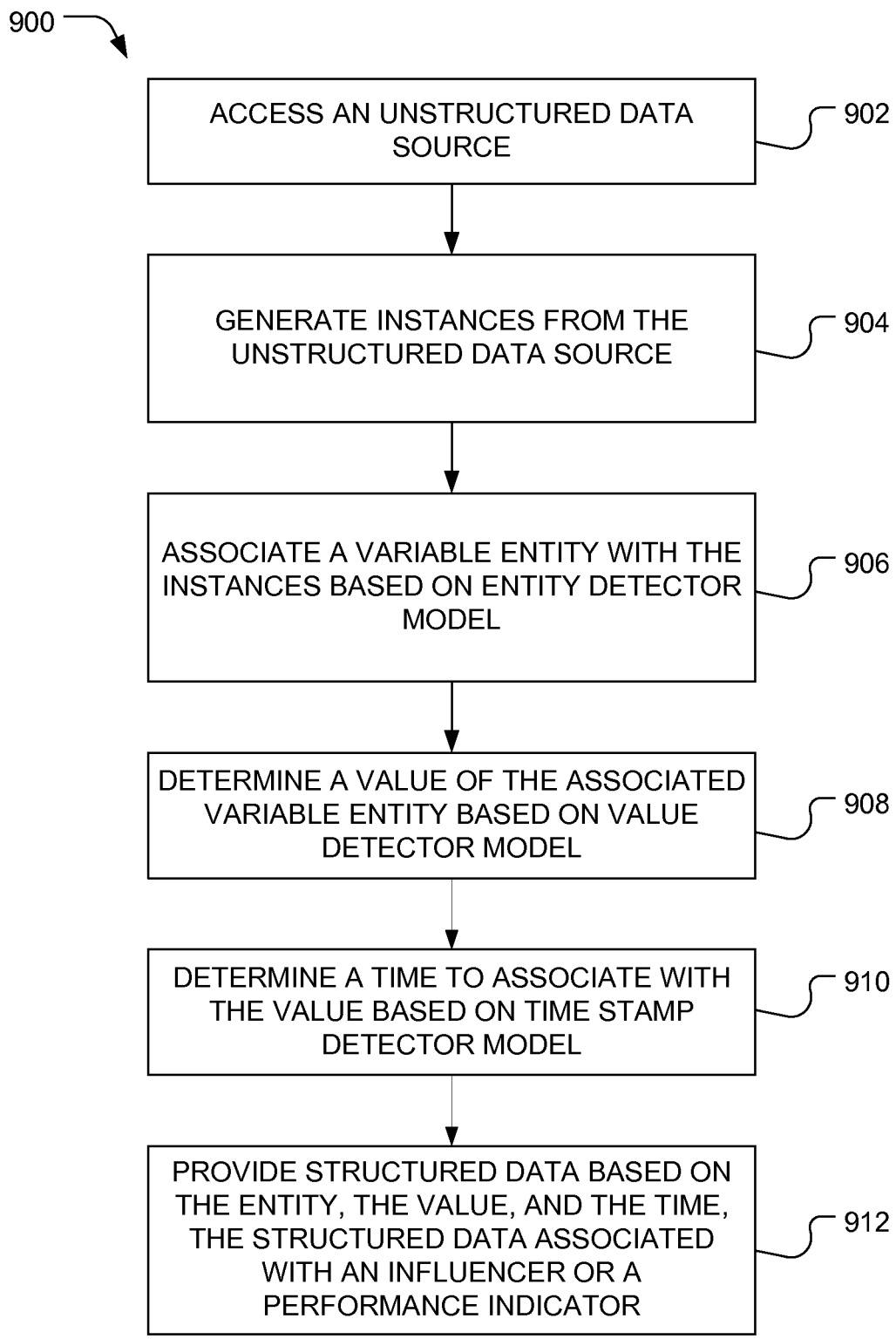
FIG. 9 includes a block flow diagram illustrating an exemplary method for processing unstructured data.

FIG. 9 illustrates an exemplary method 900 for processing unstructured data. For example, the unstructured data is accessed, as illustrated at 902. Such accessing includes accessing a memory storing the unstructured data or acquiring the data from an interne source, a data stream, or broadcast source.

As illustrated at 904, instances are generated from the unstructured data. For example, a video file may be processed to form frame images and extract audio data from the video data source. In another example, an audio data source can be processed to extract background noises, or parse human voices and speech. In a further example, the audio source can be processed to generate text. In another example, narrative texts can be processed to generate sentences or phrases as instances.

In an example, the instances can be generated through user interaction or through automated methods. The system can implement an interactive user interface to manipulate the unstructured data source and generate the instances. In another example, the system can automatically generate the instances. Automated methods can include supervised and automated supervised methods. In an example, a training set can be annotated and provided to the system for training. A test set can be provided to test the system performances following training. In particular, a k-fold training in which several training and test sets are provided to the system can be implemented. In an automated supervised method, a set of rules or features can be identified. The system can auto-annotate a training set. The accuracy of subsequent tests can be monitored by a user. For example, extractors and detector models can be trained and tested for processing unstructured data as described in relation to FIG. 10 and FIG. 11 below.

A variable entity can be associated with the instances based on an entity detector, as illustrated at 906. The entity detector may specify which instance type or metadata associate with the instance qualifies the instance for association with a variable entity. For example, facial expression type variables can be associated with images or frames of a video but not with audio data.

As with the instances, the variable entities can be assigned through user interaction or through automated methods. The system can implement an interactive user interface to associate a variable entity with the instance. In another example, the system can automatically associate a variable entity with the instance. Automated methods can include supervised or automated supervised methods, as described above.

Once the variable entity is associated with an instance, a value associated with variable entity can be determined from the instance based on a value detector, as illustrated at 908. In particular, the value detector can identify an algorithm for processing the instance. The algorithm can be selected based on the variable type of the variable entity associated with the instance. Exemplary algorithms include voice recognition algorithms to process audio data, facial expression algorithms to process images of faces, or sentiment analysis for processing narrative texts, among others.

Optionally, a time stamp can be associated with the value based on a timestamp detector, as illustrated 910. The time stamp can be determined based on metadata within the file or characteristics within the instance that indicated time. In particular, the time detection rules can specify a granularity or format of time to be associated with the value and can specify a method, algorithm or heuristic for determining the time stamp to be associated with the value. In an example, the instance metadata can include an indicated time stamp. In another example, a time stamp can be derived from the instance based on aspects of the instance. For example, a video frame may include an image timestamp within the image of the frame. In another example, algorithms may derive a time stamp based on backgrounds within the instance. In an exemplary audio file, a timestamp may be stored within the audio data or a time stamp can be derived from spoken language within the audio file. A time stamp can be derived from narrative texts based on bylines, headings, post date, language used in the text, or any combination thereof.

As such, a set of values optionally associated with time stamps can be stored in association with the variable entity in a structured form. The structured data can be associated with an influencer of a set of influencers or a performance indicator of a set of performance indicators, as illustrated at 912. Such structured data can be used to perform predictive analysis or other techniques, such as Prescriptive Analytics®.

For example, a video image taken at a position down well can be used to determine composition of a multiphase flow. The video can be samples to provide instances including a set of frames. Each frame of the set of frames can be designated an image entity that depicts multiple phases. A compositional value can be extracted by determining cross-sectional areas of a phase, for example, using edge analysis to find the areas. The areas can be averaged across the set of frames to provide a composition value. In an example in which each frame includes a time stamp, either in metadata or as part of the image, a time stamp can be determined either by reading the metadata or by character recognition of the time stamp. The compositional value and the time stamp comprise structured data that can be applied to a well model or a field model to predict performance characteristics or prescribe actions that would improve the performance characteristics, such as production.

Figures 10, 11:
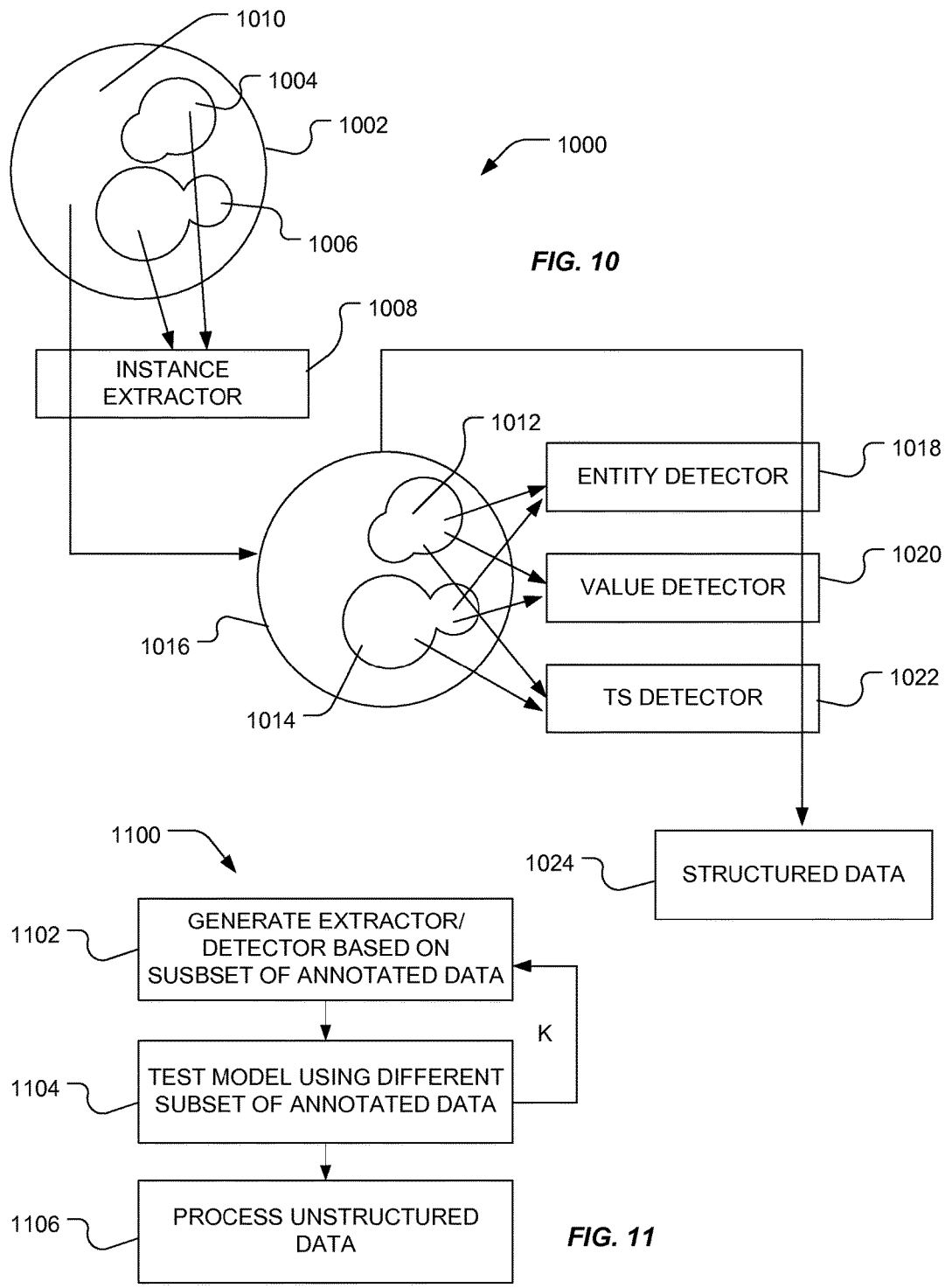
FIG. 10 includes an illustration of an exemplar system for processing unstructured data.
FIG. 11 includes a block flow diagram illustrating an exemplary method for processing unstructured data.

FIG. 10 illustrates a system 1000 in which unstructured data is used to generate an instance extractor, an entity detector, a value detector, or a timestamp detector. For example, unstructured data 1002 can be provided to the system including a set of data annotated with associated instances. For example, a subset of the annotated data 1004 can be used for calibrating an instance extractor 1008 and a second subset of annotated data 1006 can be used to test the instance extractor 1008. Optionally, additional subsets of annotated data can be provided to further train and test the instance extractor 1008. For example, the instance extractor 1008 can be generated using k-fold training. The data used for each training cycle can be manually assigned. Alternatively, the annotated data used for the training cycles can be randomly assigned to subsets. Once the instance extractor 1008 is trained, unstructured data 1010 that is not annotated with associated instance can be processed through the instance extractor 1008 to provide instances 1016.

One or more subsets of the instances 1016 can be annotated with structured data. For example, a subset of annotated instances 1012 can be utilized for training one or more models, such as a variable entity detector 1018, a value detector 1020, or a timestamp detector 1022. One or more second subsets of the annotated instances 1014 can be used to test the variable entity detector 1018, the value detector 1020, or the timestamp detector 1022. One or more additional subsets of annotated instances can be used to further train or test one or more of the variable entity detector 1018, the value detector 1020 or the timestamp detector 1022 in a k-fold training process. Data from within the annotated subsets can be selected manually or can be selected randomly. Further, the variable entity detector 1018, the variable value detector 1020, and the timestamp detector 1022 can be trained using the same subsets of annotated data or can be trained using different subsets of annotated data.

Once the variable entity detector 1018, the variable value detector 1020 and the timestamp detector 1022 are trained, additional instances 1016 can be processed through the detectors (1018, 1020, or 1022) to provide structured data 1024. The structured data 1024 can be used to generate a predictive model and can be used as inputs to such a predictive model to generate predictions.

As illustrated in FIG. 11, a method 1100 generates extractor/detector models that can be used to process unstructured data. For example, unstructured data that is annotated with instances can be provided. In another example, instances that are annotated with structured data can be provided. Using the annotated unstructured data or the annotated instances, the system can generate an instance extractor or a detector, such as a variable entity detector, a value detector, or a timestamp detector, as illustrated at 1102 using a subset of the annotated data.

Using a different subset of the annotated data, the extractor or detector can be tested, as illustrated at 1104. The training and testing of the extractor or detector can be repeated in a k-fold training process. Subsets of annotated data can be selected manually or can be selected at random or can be selected automatically using various heuristics.

Once a satisfactory extractor or detector is generator and trained, unstructured data can be processed through the extractors and detectors, as illustrated at 1106, to generate structured data. Such structured data can be used to generate predictive models or can be used as input to predictive models to generate predictions.

In an example, the unstructured data can take the form of video, images or frames of video, sound, or text. In an example, instances can be extracted from video using foreground analysis. For example, video can be analyzed by observing static versus dynamic or changing pixels to identify foreground images versus a background. Background data can be removed and the video instances be provided in 1 min. segments. In another example, foreground images can be extracted as frames from the video.

In a further example, images or video frames can be utilized to extract information about individuals within the images. For example, an image can be processed to detect whether the image includes an image of a person and further processed based on whether a color of clothing, skin or the shape of an eye is present in the image. In a further example, sound files can be extracted based on the presence of human voices. Instances can be extracted to provide segments of human voice, such as 1 min. segments of human voice. In an additional example, text can be extracted to locate sentences within the text. Each sentence can be extracted as an instance.

The instances can be processed to determine an entity, value, or a timestamp. For example, video segments, or images can be processed to determine gender of individuals depicted within the video segment instances or the image instances. The video segment or image instance can be used to detect a person using an entity detector. Those instances that include a person can be processed using a value detector to determine whether the person is male or female. The instance can be further processed using a timestamp detector to detect a timestamp of the instance.

In another example, various instances can be used to determine an emotional state. For example, a video segment can be tested to find a face using an entity detector. Similarly, images or video frames can be processed using the entity detector to determine those images or video frames that include a face. Using a value detector, an emotion may be inferred based on the face. In an example, an angry emotion, neutral emotion, or sad emotion can be identified using the value detector. A timestamp detector can be further used to determine a timestamp of the instance. For video, the identified emotions may be aggregated or averaged over time or segments grouped by category based on the occurrence of an emotion within the segment of video.

A sound file can be processed to find emotion by determining human voices within an instance using an entity detector. Using a value detector, the nature of the emotion (e.g., angry, sad, neutral . . . ) can be determined. As with a video segment, the determined emotion may be aggregated and averaged over the over the sound for a period of time over which the sounds segment is extracted.

In relation to text, sentence instances can be evaluated for the existence of language indicative of emotion. Using a value detector, the nature of emotions connoted by the sentence or through the sentence can be determined.

In a particular example, a video of multiphase flow within a well bore can be analyzed for regions or areas depicting different phases. From cross-sections of the regions or areas, composition of the multiphase flow can be determined.

Once the extractors and detectors are trained, unstructured data can be processed to determine structured data. The structured data can be used as influencers and performance indicators in a predictive system.

In an embodiment, a system predicts problems that can occur, providing an indication of both the nature of the problem and when it is expected to occur. The problems can be expressed as deviations in performance indicators that violate business criteria. For example, a problem can be expressed as the value of a performance indicator crossing a threshold. In addition, the system supports testing of solutions to the predicted problem. The solutions are expressed in terms of what action to take and when to take such action. As such, the system assists with determining a desirable set of future actions to maintain a business process in compliance with business criteria. Deviations from performance indicators that violate business criteria can also include opportunities from which the business can benefit. For example, when a future customer satisfaction score exceeds a threshold, the business can decide to reduce its service level and thus, reduce cost.

Businesses rely on business processes to function. Evaluating how well that business process is performing allows a business to allocate resources, increase production, improve its position in the market place, increase profitability, or any combination thereof. For example, a business process can include a call center, the function being customer service or technical support. In another example, the business process can include field services, the function being product installation or repair. In a further example, the business process can be a marketing department, the function being to control public perception of the business or a response rate. In additional examples, the business process can include transactions services, finance and accounting, manufacturing, logistics, sales, or any combination thereof.

In a particular example, hydrocarbon production relies on business processes, such as planned drilling, fracture of wells, reworking perforations, production logistics, shut-ins, and other processes to improve recovery from a producing structure.

In particular, evaluation of the business process can be correlated with performance indicators (PIs). One or more performance indicators (PIs) can be used to quantify how well a business process is performing. For example, a call center can quantify performance using performance indicators, such as customer satisfaction, problem resolution, productivity indicators, cost indicators, or any combination thereof. In hydrocarbon production, performance can be evaluated based on well production, total field production, and field management for a production stage or aged field.

Once determined, the performance indicators (PIs) can be compared with business criteria to determine whether the business process is performing as desired. For example, a business criterion can include threshold values, limits on rates of change, heuristics associated with aspects of the business function or any combination thereof. For example, the performance indicator (PI) can be compared to a threshold value to determine whether the performance indicator (PI) is within a desired range or is in violation of the threshold, indicating poor performance or an unnecessary high performance.

The performance indicators (PIs) are influenced by other factors associated with performing the business process. In particular, such factors are referred to as influencers and influencers correlate with the performance indicators. For example, an influencer associated with call center performance can include the number of contacts made with a customer to resolve an issue, the type of issue, hold time, shipping delays, or any combination thereof, among others. Such influencers can, for example, influence performance indicators, such as customer satisfaction and brand satisfaction. Performance indicators (PIs) or influencers can be of numerical (continuous) nature, categorical nature, or a combination thereof. Further, the PIs or influencers can be ordered or can be non-ordered. In another example, the distributions of performance indicators (PIs) or influencers are utilized or predicted. In particular, a PI distribution provides data about the underlying nature of the median or mean value. For example, when the PI relates to customer satisfaction, an average value does not provide information about the number of dissatisfied customers. An average of 80% satisfaction can be the result of all participants having a satisfaction near 80% or can be the result of several 100% satisfied customers and a few very dissatisfied customers. Identifying the existence and then cause of the few very dissatisfied customers can provide greater benefit than seeking to achieve an average value. In the case of categorical performance indicators (PIs) or influencers, such a prediction can include the prediction of the occurrence set of categories. As used below, the term "value" is used to include numerical values, categorical values, or any combination thereof. In hydrocarbon production, review of well production and compositional history can indicate a stage of production or a nature of the region around the well within the reservoir.

The influencers and the performance indicators (PIs) change over time. The change can be caused by the change of influencers or by a time dependency of a performance indicator on itself. As such, the performance indicator (PI) can deviate overtime and violate business criteria, which is indicative of a problem in the business unit or low performance. To correct the deviation, associated influencers can be manipulated. For example, more staff can be added to reduce hold time. However, immediate manipulation of the influencers to solve a problem predicted in the future can provide less than desirable solutions to the problems in the business process. For example, hiring more staff long before the hold times are expected to increase leads to higher cost in the call center. The present system can assists with determining a desirable set of future actions to maintain a business process incompliance with business criteria. In hydrocarbon production, performance can be enhanced using reworking of wells, fracturing, well shut-in, or other actions.

Figure 12:
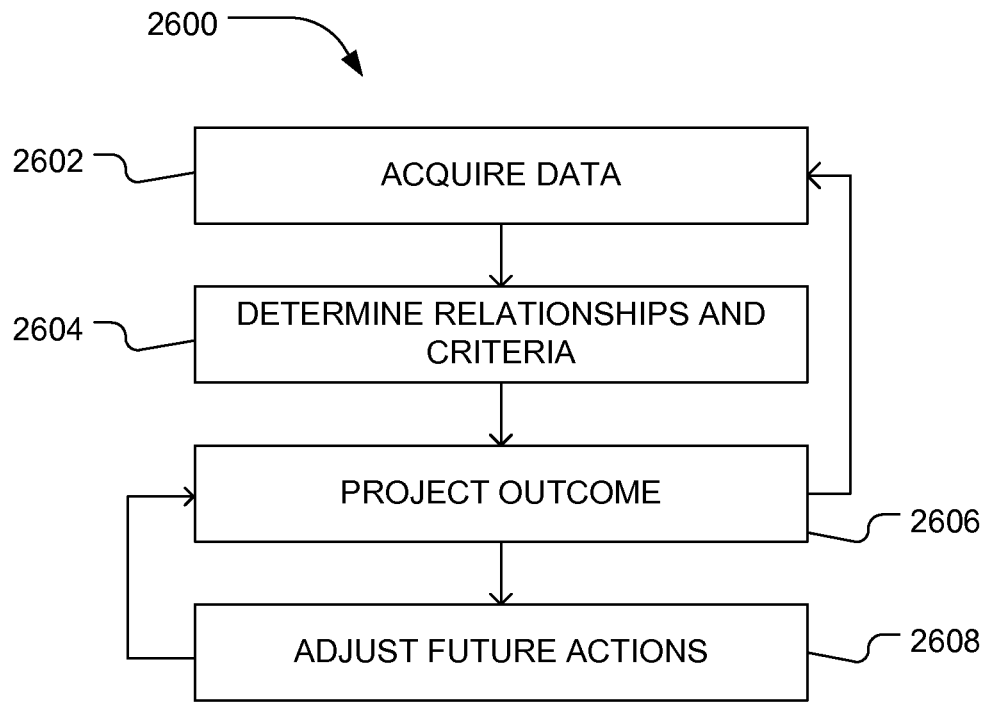
FIG. 12 includes an illustration of a flow diagram of an exemplary process.

In an embodiment, the present system performs a method to determine such a desirable set of future actions. For example, FIG. 12 illustrates a method 2600, which includes acquiring data (2602), determining relationships and criteria (2604), predicting outcomes (2606) and adjusting future actions (2608). The present system can acquire data, as illustrated at 2602, from a variety of sources. The data can be acquired from external sources. Exemplary external sources include databases, testing, or any combination thereof, among others. In particular, the data can be derived from structured sources. In another example, the data can be derived from unstructured sources. The data can be transformed and aggregated. In addition, the data can be cleaned. The resulting data can be stored in a data management system.

In an example, the system can also use streaming data sources where there is no intermediate data management system for the storage of aggregated data. Such a system is especially useful for big unstructured data sets (terabyte data) where the use of a rational database management system would be inefficient or economically unacceptable. In such an example, techniques such as Map/Reduce are applied based on Big Data processing systems like Apache Hadoop.

Once clean aggregated data is available, relationships between performance indicators and potential influencers can be determined and criteria for performance can be established, as illustrated at 2604. Such relationships permit projection of potential outcomes, which can be compared with the criteria to determine whether the business process is functioning well. In particular, the relationships can identify influencers that have a greater influence on one or more performance indicators.

As illustrated at 2606, outcomes can be projected. Projecting can include predictive analysis to determine what is to happen. Predictive analysis can include forecasting to determine what is to happen and in what time frame. In particular, such projection can include projecting the value of one or more performance indicators based on the determined relationships and expected values of influencers. In a further example, the future values of one or more influencers are projected, and the performance indicators are determined based at least in part on the future values of the one or more influencers. Projecting, and in particular, forecasting can be performed using an algorithm constrained with business rules. For example, the values of influencers or performance indicators can be constrained based on rules established by the business. In an example, one or more of the performance indicators are projected to violate one or more business criteria at future times. For example, the value of a performance indicator can cross a threshold at a future time step. In this way, the business process is provided with warning about a potential problem that may arise in the future.

The present system can also permit adjustment of future actions, as illustrated at 2608. For example, to determine a solution to a projected problem, the system can adjust, in an automatic mode or through manual adjustment, the future value of one or more influencers. The performance indicators can be projected using the adjusted influencer values to determine whether the problem is solved. In particular, the adjustment to influencer values can be made at one or more future time steps. As such, minor adjustments to an influencer value can be made during a series of time steps. In another example, a large adjustment can be made at a single time step closer to the projected violation of the business criteria. The process can be iterated to determine a particularly advantageous set of future actions that maintain the performance indicators at desired states. In particular, a performance indicator can be optimized by adjusting one or more values of the influencers. As used herein, optimizing is a process of adjusting values to meet or approach a criterion. Further, the process can be constrained based on business rules. For example, business rules can set boundaries to the values of influencers or performance indicators.

In addition, the future actions and data derived therefrom can be used to recalibrate the system. For example, new results relating actions taken can be used to inform the algorithm and for selection of an algorithm. Other processes, such as iteratively adjusting or optimizing or root cause analysis, can be performed automatically or continuously in response to new data.

Figure 13:
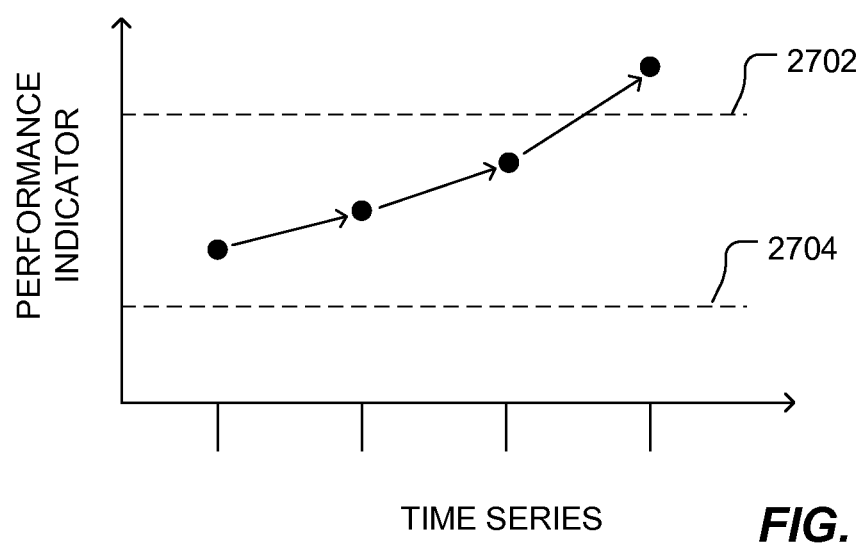
FIG. 13 includes a graph illustration of an exemplary relationship between a performance indicator and time.

To conceptually illustrate the iterations to determine a desirable set of future actions to maintain a business process in compliance with business criteria, FIG. 13 includes a graph illustration of the relationship between the value of a performance indicator and time. As illustrated, with each step in time, the value of the performance indicator changes. At the fourth time step, the value of the performance indicator violates a business criterion. The business criterion is illustrated as a threshold 2702. When the value of the performance indicator extends above the threshold 2702 or below the threshold 2704, the performance indicator has violated business criteria. Alternatively, the business criteria can be expressed as limits to a rate of change. In another example, the thresholds can have difference values at different times.

Figure 14:
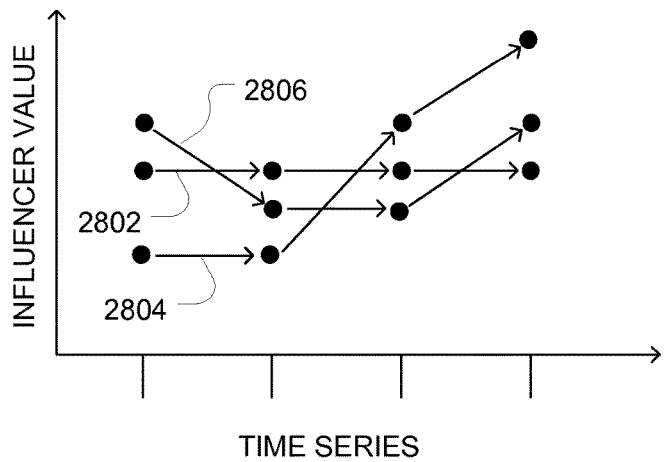
FIG. 14 includes a graph illustration of exemplary relationships between the value of influencers and time.

FIG. 14 illustrates expected influencer values over time. To more easily visualize a comparison, the values can be normalized. While a multiline chart is used to illustrate FIG. 14 for conceptual purposes, the influencer values can include categorical values, numerical values, or any combination thereof. For example, an influencer 2802 can have constant values at each of a series of time steps. In another example, an influencer 2804 can have values that increase with each subsequent time step. Alternatively, the value of an influencer can fluctuate with each time step. For example, an influencer 2806 can decrease in a first time step and increase at a subsequent time step. While the values of three exemplary influencers are illustrated, influencer values can be projected to increase, decrease, or remain the same with each time step in the time series.

In particular, the influencer values or categories can be projected based on known factors and prior history. For example, if call volume or hold time are considered influencer of customer satisfaction in a call center, it may be projected, based on past experience, that call volume and hold time increase during holiday seasons. In a field service process for a heating and air conditioning company, service calls can increase during summer months in Southern regions and increase in winter months in Northern regions. As such, embodiments of the present system can utilize manually set values of influencers, projected values of influencers, or any combination thereof.

Figure 15:
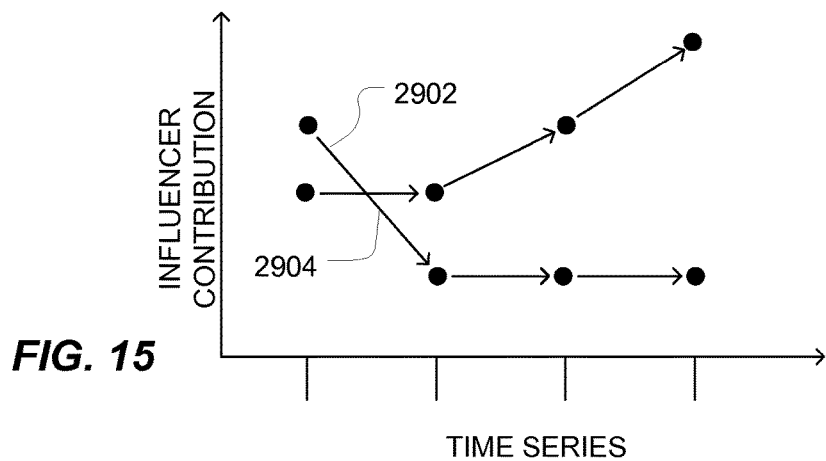
FIG. 15 includes a graph illustration of exemplary relationships between time and the contribution of an influencer to the value of a performance indicator.

Each influencer can contribute to the projected value of one or more performance indicators and each performance indicator can be a function of one or more influencers and time. In particular, determining the relationship of influencers and performance indicators includes determining the contribution of each influencer to the value of a projected performance parameter. Such conceptual contributions are in practice a model derived from data and relevant algorithms. FIG. 15 illustrates conceptually the contribution of two influencers to a projected performance indicator. In addition to the value of the influencer, the value of the performance indicator can be influenced by how much a particular influencer influences the value of the performance indicator at future time steps. For example, the contribution of an influencer 2902 to the value of a performance indicator can decrease over time. As illustrated, the value of influencer 2902 contributes significantly to the current value of the performance indicator. However, the value of the influencer 2902 contributes less to projected values of the performance indicator. In such an example, the influencer 2902 may not correlate with future values of the performance indicator. In contrast, the contribution of an influencer 2904 to the value of a performance indicator increases at subsequent time steps. For example, the value of the influencer 2904 can correlate strongly with the value of the performance indicator at a future time step.

Using the influencer values or categories, whether projected or manually set, and using the relationships of such influencer values or categories on future values of the performance indicator, the system can project performance indicator values or categories over a series of future time steps and iteratively adjust the influencer values or the occurrence of categories at future time steps to determine desirable changes to influencer values or categories at future time steps that maintain the performance indicators in balance with the business criteria.

Figure 16:
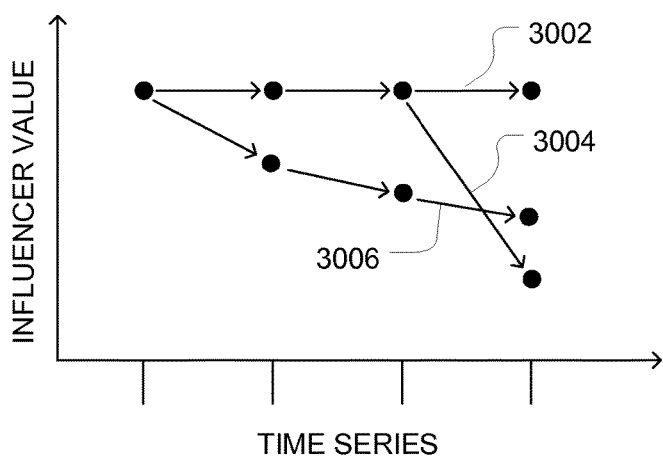
FIG. 16 includes a graph illustration of exemplary changes to the value of an influencer projected over time.

For example, FIG. 16 includes an illustration of sets of changes that can be made to the values of an influencer through a time series. In an example, the value of the influencer can be constant through time, as illustrated at 3002. Such a path (set of consecutive values of an influencer) can lead to a violation of a business criterion by performance indicators. To prevent violation of the business criterion, the influencer can be decreased at at least one future time step. For example, at a third time step the influencer can be reduced significantly, as illustrated at 3004, to prevent a violation. In another example, the influencer can be gradually reduced over a series of time steps, as illustrated at 3006. As such, different paths or sets of changes to an influencer value can be assessed to determine a preferred path that maintains the business process in compliance. In an example, such a path can be preferred because it is a lower cost solution or has advantages not present with other paths.

As such, embodiments of the present system can assist with determining a set of future actions (changes to influencers) that maintain a business process, as quantified by performance indicators, in compliance with business criteria. In other words, the present system can assist with determining which changes to make to a business process and when to make such changes. For example, the system can assist with determining a schedule for refracturing, reworking, well shut-ins, or other treatments of well in hydrocarbon or fluid production.

Figure 17:
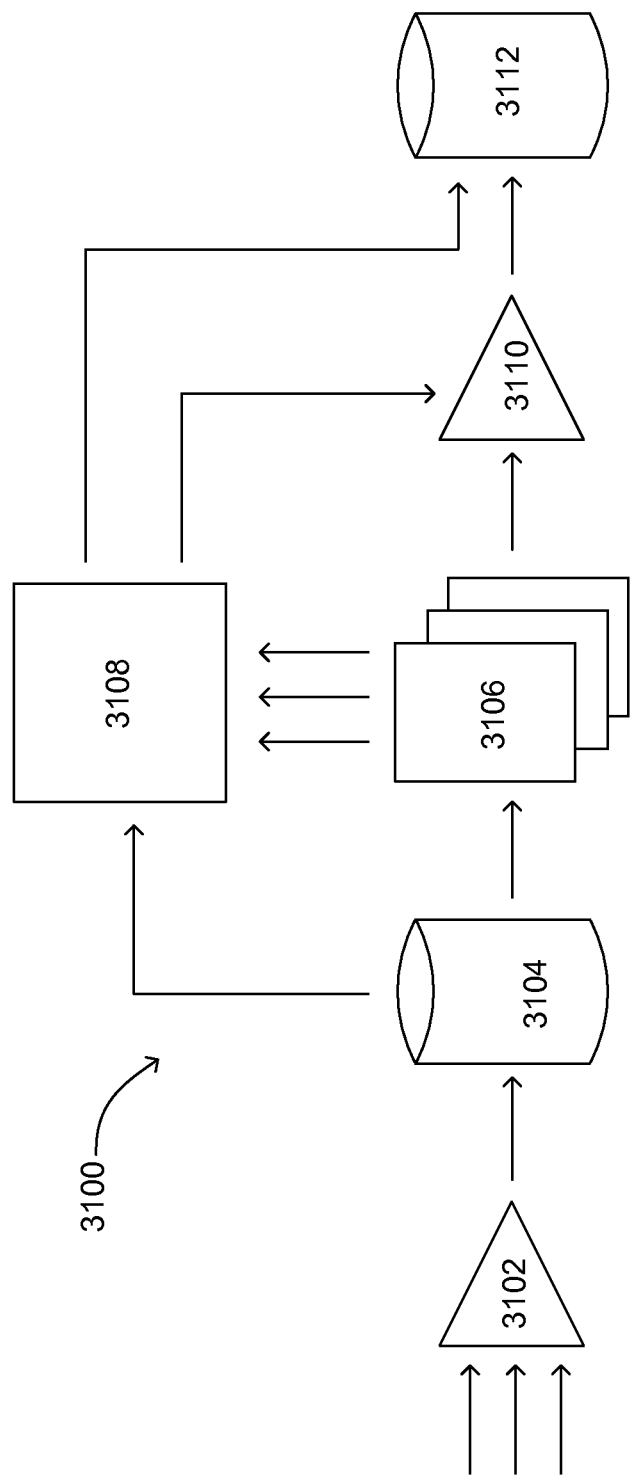
FIG. 17 includes an illustration of an exemplary process for predictive decision making.

In an embodiment illustrated in FIG. 17, the present system 3100 includes tools 3102 for processing raw data gathered from external sources. For example, the tools 3102 can assist with loading data from external sources, transforming the data into desirable formats, aggregating the data, and cleaning the data.

In particular, the data can be derived from structured sources, such as databases, tables, listings, or any combination thereof. In another example, the data can be derived from unstructured sources. Unstructured sources are sources that are interpreted using human or artificial intelligence and, for example, include video sources, audio sources, narrative text, or any combination thereof. Narrative text includes, for example, articles, blogs, emails, and other writings in prose, such as those available via the interne or electronic sources. Further, unstructured sources can include documents having narrative text and including enriched formatting, such as tags. For example, the unstructured source can include a narrative text document formulated in a hypertext, XML or tagged format. Once processed, the data is stored, for example, in a data management system, such as a database 3104.

The data and a set of algorithms 3106 can be used to prepare models. Algorithms 3106 can take the form of heuristics or the form of algorithms to form regression models, Markov chains, time series models, state space models, Bayesian models, neural networks, or any other appropriate model, or any combination thereof. In particular, exemplary algorithms 3106 include autoregressive integrated moving average (ARIMA), seasonal ARIMA (SARIMA), autoregressive conditional heteroskedasticity (ARCH), or generalized autoregressive conditional heteroskedasticity (GARCH), among others. The data can be applied though the algorithms 3106 to provide relationships and models between influencers and performance indicators, which can be validated against a test set from the original data, at validation 3108. Validation 3108 results can be used by selector 3110 to select a preferred model 3106. The model is assembled and stored in a model management system 3112, through which performance indicators can be projected and desirable paths of influencer values determined.

Once prepared, embodiments of the present system can apply new external data, in addition to existing data, to project the values of influencers and performance indicators. A user can configure the system, establishing, for example, a period over which projects are to be made, and other parameters associated with the system. In addition, embodiments of the system can assist with ranking a set of influencers based on their contribution to a particular performance indicator. A small change in a high ranking influencer can have a greater effect on a performance indicator than a large change in a low ranking influencer. Such a ranking can be used to perform root cause analysis. Further, the system can be tested for accuracy based on the model.

Figure 18:
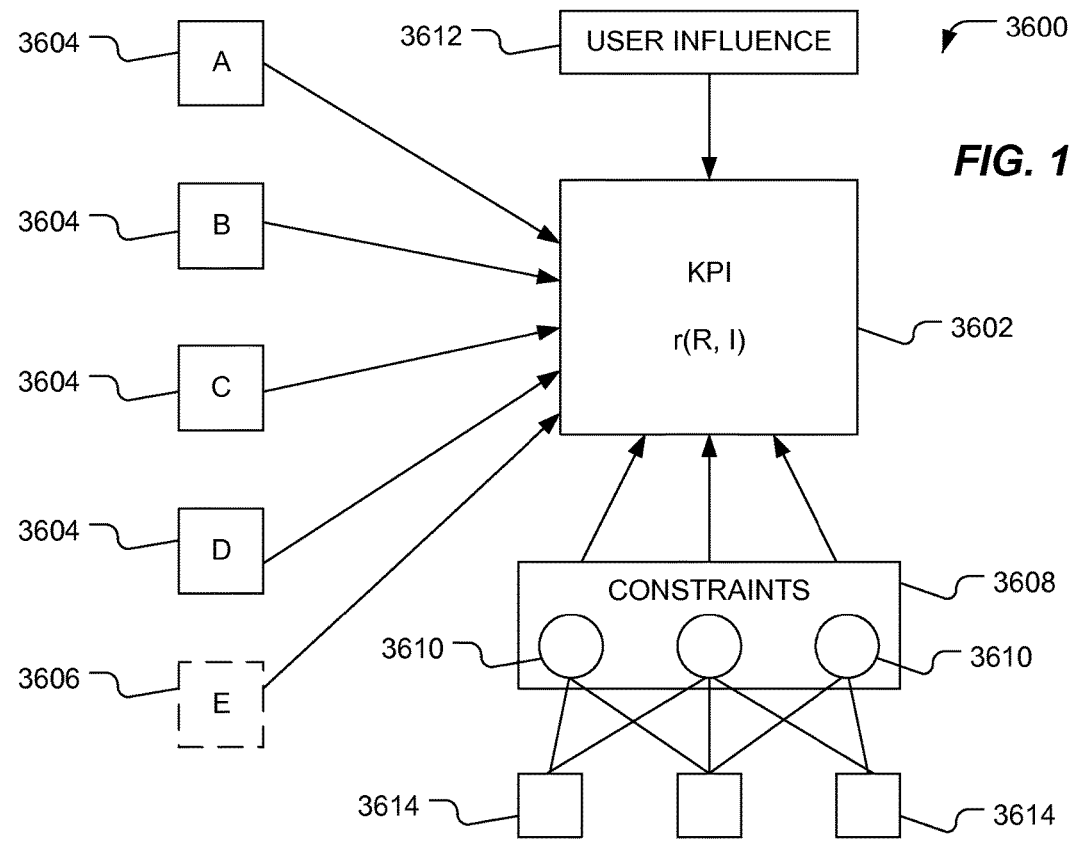
FIG. 18 and FIG. 19 include illustrations of exemplary methods for determining key performance indicator values.

In a further explanation of the system, key performance indicators 3602 are influenced by influencers 3604 as constrained by constraints 3608, as illustrated in FIG. 18. Further, a user 3612 can influence the relationships established between constraints (R) and influencers (I). For example, a user can select parameters, a type of model, or other factors that influence how a relationship (r) is established between the influencers 3604, the constraints 3608, and the KPI 3602.

Such a relationship (r) permits the determination of the KPI 3602 at one or more future time periods based on present and future values of influencers 3604 subject to constraints 3608. In addition, such a relationship (r) is useful for determining the influence of small changes in the influencers 3604 on the KPI 3602 at a selected future time. As a result, root cause analysis can be performed specifically for the selected future time or generally across time periods. In addition, the system can automatically or iteratively determine a set of actionable tasks including changes to influencer values over time to provide future KPI values 3602 that do not violate business rules, subject to constraints 3608. A business rule can be a constraint. Alternatively, a business rule can be different than a constraint. In a further example, a user can manipulate one or more future values of a selected influencer 3604 to determine the effect on the future value of a key performance indicator.

The constraints 3608 can take a variety of forms including box constraints, functional constraints, quantized constraints, step constraints or any combination thereof. The constraint may not be static over time. In particular, the system can indicate that a constraint is to be changed based on auxiliary data. As a result, a constraint can evolve over time, providing an indication of new business rules or a new paradigm discovered through data provided to the system. For example, a range associated with a box constraint can be changed when a value of the KPI or an influencer is frequently in violation of limits of a box constraint. Such sticking to an upper or lower constraint can indicate that a more optimal solution is found in a different range of the influencer value. When the constraint is a function, the form of the function or the parameters associated with the function can change over time as data is provided to the system. Such constraints can also be a relationship based on business rules and performance indicators. In an additional example, a constraint can limit the range of an associated influencer based on the temporally adjacent values of the associated influencer. In an example, constraints 3610 are each influenced by external data 3614. As external data 3614 is provided to the constraints 3610, constraints can change or can provide a user with an indication that the constraint should be reconsidered. In such a manner, new business rules can be discovered, preconceived notions of doing business can be reevaluated, and adjustments to the constraints can be considered.

Determining whether to change a constraint or other rules within the system can be performed utilizing meta-rules. Meta-rules can apply a generalize rule to constraints based on the type of constraint or the behavior of data associated with the constraint. For example, when a prescribed influencer is at the top or the bottom of a box constraint for a set number of times, the system can indicate that the constraint should be reconsidered. In another example, when an influencer exhibits erratic changes providing a high variance in influencer values, the absence of a constraint or a preference for reconsidering constraints can be indicated. In such a manner, business rules and other constraints can be adaptive, compensating for changes in a business environment.

In a further example, analysis by user 3612 can influence the nature of the relationship. Using techniques, such as Bayesian networks, can indicate whether additional influencers should be included in the relationship (r). For example, analysis of the system can indicate that an additional influencer 3606 should be provided to establish a relationship (r) for determining future KPI values. As such, the system can assist with building a relationship model, selecting appropriate influencers, and introducing or removing influencers as a business environment changes or the influencers lose influence on the KPI.

Figure 19:
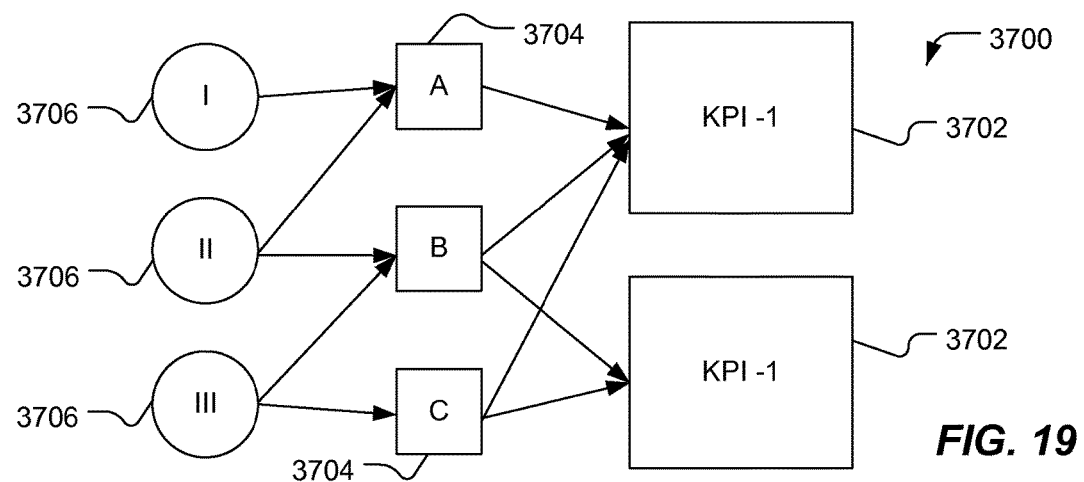

Such networks can be further utilized to translate actions 3706 into influencers 3704 that are used in relational models to determine values of the performance indicators 3702, as illustrated at FIG. 19. In particular, exemplary action hierarchies can combine user actions 3706 into differing influencers 3704 that provide relationships for determining future values of key performance indicators. In this way, the system 3700 can provide a way of translating actionable business actions to future values of key performance indicators using intermediary influencer values. When influencer values are determined for a future actionable pathway, actions 3706 can be determined from influencers 3704 and implemented by a user.

The future value of an influencer can also be limited by values of temporally neighboring future values. For example, an influencer at a first future time can limit the value of the influencer at a second future time. Such a limit can be expressed based on step limits (e.g., maximum permissible change). In another example, the limit can be expressed as a function of time. For example, limits on the value of an influencer can change based on time, either relative or according to a calendar.

When limits to influencer values are a function of time or other influencer values, optimization to achieve a desired key performance indicator value can take longer to implement. For example, when an influencer value is functionally constrained based on time, changing the value of the influencer to a substantially optimal value can be prevented until the functional constraint permits the influencer to have the substantially optimal value.

In a further example, the relationships for predicting the KPIs can be recalibrated. In particular, a trigger rule can be evaluated when new data is received. For example, a predicted value of a KPI can be compared to an actual value and when the difference is significant, such as beyond a threshold, recalibration can be triggered.

Recalibration can include adjusting parameters of a model based on new data. The system can also determine that the previous model no longer reflects the relationships between influencers and performance indicators. A model can be restructured to better reflect the relationships. In another example, a new influencer can be added to the model. In a further example, a new type of algorithm or model can be selected and the parameters determined for the new type of algorithm or model based on the new data and past data. Once recalibration is performed, the system can provide an updated prediction, root-cause analysis, or prescription.

Further, the system can provide a warning when suggested actions are not implemented. For example, when the system predicts that a future value of a key performance indicator will be in violation of a business rule and prescribes an action and when new data indicates that the action was not implemented and the key performance indicator will be in violation of the business rule, the system can provide an indication or send a message to a supervisor indicating that the actions were not taken. For example, an indication can be displayed on an interface device, sent via email, sent as a text message, or provided as a voicemail.

Figure 20:
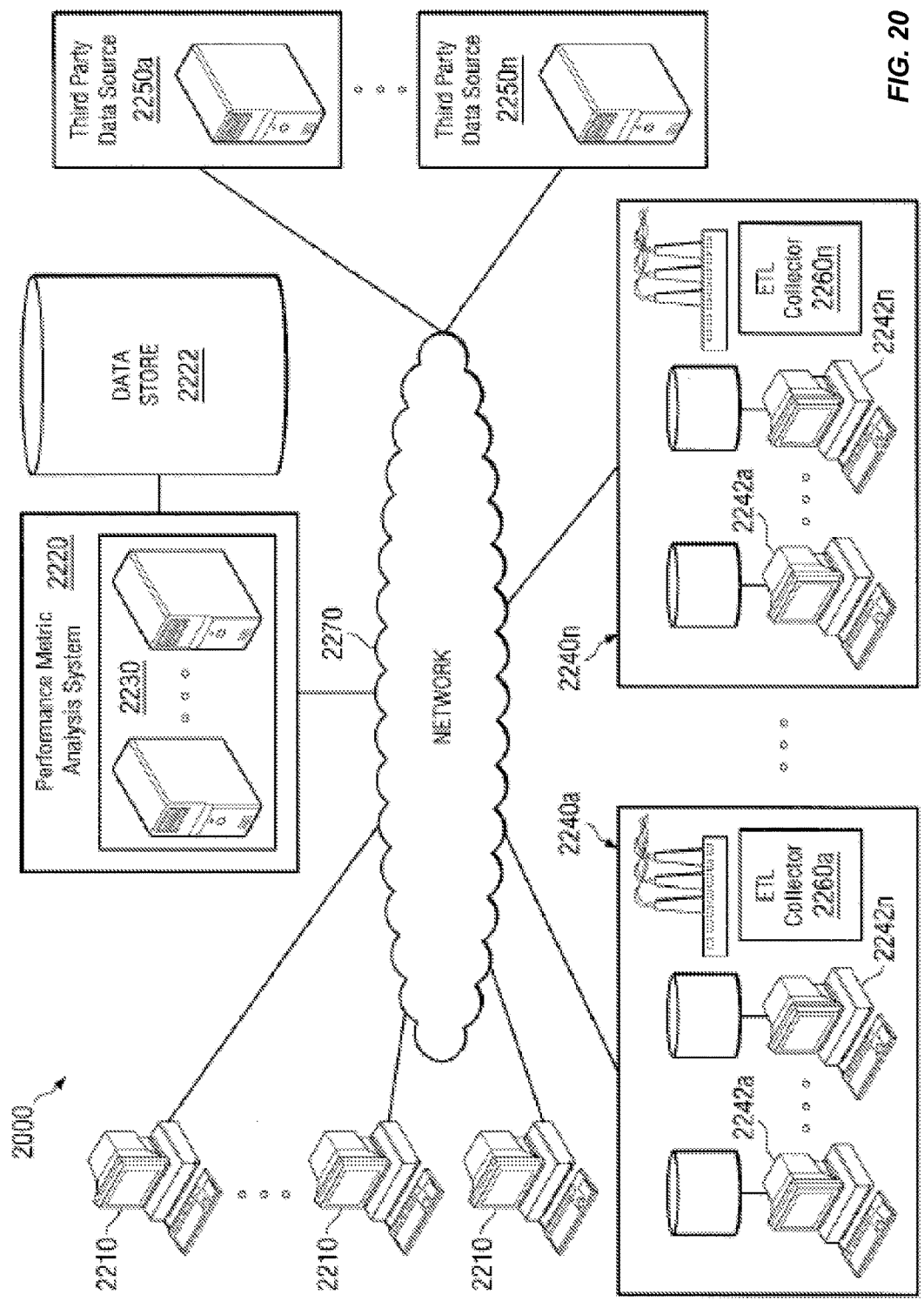
FIG. 20 is a diagram illustrating one embodiment of a topology which can be used in conjunction with an implementation of embodiments of the present invention.

Embodiments of the systems and methods of the present invention can be better explained with reference to FIG. 20 which depicts one embodiment of a topology which can be used to implement embodiments of the systems and methods of the present invention. Topology 2000 comprises performance metric analysis system 2220 (including associated data store 2222) comprising one or more computer devices 2230. These computing devices 2230 can, for example, by organized as a cluster which can be a loosely or a tightly coupled cluster and include one or more load balancers (not shown). Performance metric analysis system 2220 (e.g. one or more of computing devices 2230) can be coupled through network 2270 to computing devices 2210 (e.g. computer systems, personal data assistants, kiosks, dedicated terminals, etc), one or more locations of an entity 2240 and one or more third party data sources 2250 operable to provide, for example, market data, benchmarking data, etc. Network 2270 can be for example, the Internet, a wide area network (WAN), a local area network (LAN) or any other type of conventional or non-electronic communication link such as mail, courier services or the like.

Generally speaking then, entity 2240 can be a business, non-profit, or other type of entity which implements a process. This process can, for example, be a business process which relates to the functionality or performance of the entity. As discussed above, for example, such business processes can comprise the implementation of customer service through a contact or call center, the implementation of transaction services, the management of supply or demand chains or other inventory management, the implementation of field services, the implementation and management of sales pipelines, etc.

No matter the type of processes implemented by the entity 2240 however, it can be useful to measure or otherwise analyze (including predicting, simulating, optimizing, etc.) the performance of such a process utilizing a performance metric, such as a KPI as discussed above. Accordingly, entity 2240 can desire to utilize and monitor these performance metrics related to these processes for a variety of reasons, including improving the performance of such processes, reducing the cost of implementing such processes, controlling the quality of such processes, preempting issues which can occur in the future with respect to these processes, substantially optimizing solutions to future problems and predicatively determine the effect of certain solutions to anticipated future problems, etc.

To that end, performance metric analysis system 2220 can gather data from entity 2240 or a third party data source 2250 to analyze such data to perform analysis on such data and can present an interface such that one or more users at computing devices 2210 can determine what analytics are utilized, the data used for these analytics, view, or affect the results, of such analytics, etc. Embodiments of such interfaces have been discussed previously herein.

More specifically, in one embodiment, performance metric analysis system 2220 can implement a set of analytics comprising at least predictive analytics, root-cause analytics, optimization and what-if simulation. Colloquially speaking, predictive analytics allows users (for example, associated with entity 2240) to identify and quantify problems (including opportunities) related to one or more performance metrics, root-cause analysis allows users to identify, quantify and rank influencers of performance metrics which can cause any upcoming problems, optimization can determine substantially optimum solution to preempt (or benefit from) any determined upcoming problems and what-if simulation allows a user to determine the effect of prescribed solutions on performance metrics.

To implement such analytics, performance metric analysis system 2220 can gather data directly or indirectly related to one or more performance metrics from entity 2240. Entity 2240 can have multiple locations 2240a, 2240n where each entity location 2240a, 2240n can comprise multiple servers or other types of computing devices 2242 which are involved in the implementation of the process by the entity 2240 or the storage of data involved with the implementation of the process. In some instances, entity locations 2240a, 2240n can have computing devices which run according to different operating systems or protocols, or which implement different types of applications or databases in conjunction with the process.

Each entity location 2240a, 2240n can have an associated ETL collector 2160 which is responsible for collecting appropriate data regarding the process or one or more associated performance metrics from various computing devices 2242 utilized in the implementation of the process or used to store data involved with the implementation of the process. ETL collector 2260 can send the data gathered at the corresponding entity location 2240 to the performance metric analysis system 2220 in response to a request from the performance metric analysis system 2220.

Thus, performance metric analysis system 2220 can, based upon one or more schedules, send out requests to each ETL collectors 2260 at each of the entity locations 2240a, 2240n and receive, in response, a set of data corresponding to that performance metric and that entity location 2240a, 2240n collected over a certain time period. This data can be stored in data store 2222. Analytics can then be performed by the performance metric analysis system 2220 using the data gathered from the entity locations 2240a, 2240n. The analytics performed by performance metric analysis system 2220 can be determined, at least in part, by a users interaction with an interface presented by performance metric analysis system 2220 and the results of the analytic performed can similarly be displayed to a user through the provided interface.

Not all of the various entities depicted in topology 2000 are necessary, or even desired, in embodiments, and that certain of the functionality described with respect to the entities depicted in topology 2000 can be combined into a single entity or eliminated altogether. The topology 2000 is therefore exemplary only and should in no way be taken as imposing any limitations on embodiments of the present invention.

Each of the above disclosed methods can be performed on multiple systems. For example, the methods can include processing data streams from a file system. The file system can be distributed, particularly for large data sets. A method can be partitioned in such a way, that it can perform the operations on a partition or subset of the data. Such processing is particularly useful for unstructured data sources having large file size. The results of such processes can be combined in such a way that the result is identical to the method applied to a single data source being combined of all of the partitioned data.

In different embodiments, any presently-disclosed apparatus (or any presently disclosed computer product including a computer usable medium) can be configured or operative to any presently disclosed method or technique.

A computer program product, includes a computer usable medium having a computer readable program code non-transitorily embodied therein, said computer readable program code adapted to be executed to implement a method as described above.

In the present disclosure, certain routines for calculating data or displaying data may be carried out 'in accordance with' a certain factor—for example, influencer identifiers may be ordered or selected in accordance with magnitudes of one or more deviations. When a routine is carried out 'in accordance with' a certain factor or factors, the routine can also be carried out in accordance with one or more 'additional factors' or additional business rules (for example, displayed identifiers may be ordered both according to magnitudes of deviations as well as whether or not the influencer is designated as an 'external influencer' or a 'controllable influencer:'). In the present disclosure, the phrase 'in accordance with' (or 'according to') should be interpreted as 'at least in part in accordance with.'

As described above, "controllable influencers" and "actionable influencers" are analogous terms. In an example, an influencer can be a business input. For example, an influencer can be a measurable business input, such as a business input relating to an action, a business function, or other business relevant data. A key performance indicator can be a business output, such as a measurable indication of performance of a business function.

A continuous value control element is a control element that can represent many values within a range of values. An exemplary continuous value control element includes a slide element, a dial, direct input e.g., (text input), keyboard input (e.g., up or down arrows), or a combination thereof. A binary value control element is a control element that can represent one of two states. An exemplary binary value control elements includes a checkbox, toggle button, radio button, or any combination thereof. Alternatively, a tri-state control element can be used in place of a binary value control element.

In a first aspect, a non-transitory storage medium including instructions operable to implement a method and the method of projecting a production characteristic includes receiving down well video image data depicting multiphase flow within a well, determining a flow rate data of at least one phase of the multiphase flow based on the down well video image data, and projecting the production characteristic based at least in part on the determined flow rate using a well performance model.

In an example of the first aspect, the method further includes building the well performance model based at least in part on the determined flow rate data.

In another example of the first aspect and the above examples, projecting the production characteristic include projecting a change in flow rate of the at least on phase.

In a further example of the first aspect and the above examples, projecting the production characteristic include projecting a change in flow rate of the at least on phase in response to a well treatment. For example, the well treatment includes fracking. In another example, the well treatment includes reworking.

In an additional example of the first aspect and the above examples, the flow rate data includes an average ratio of a hydrocarbon phase relative to one or more other phases of the multiphase flow.

In another example of the first aspect and the above examples, the flow rate data includes an average volume percent flow.

In a further example of the first aspect and the above examples, the down well video image data includes video image data from a first position within the well and video image data from a second position within the well.

In an additional example of the first aspect and the above examples, projecting the production characteristic includes projecting a change in flow rate data in response to treating the well.

In another example of the first aspect and the above examples, the method further includes aggregating flow rate data from a number of wells and building a field model. For example, the method can further include projecting a field production characteristic based at least on the field model and the aggregated flow rate data.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of projecting a production characteristic, the method comprising:
   receiving down well video data depicting multiphase flow within a well;
   determine cross-sectional areas associated with a phase of the multiphase flow within frames of the down well video data; and
   determining a composition of the multiphase flow based on the determined cross-sectional areas;
   wherein the frames are selected periodically from the down well video data.

2. The method of claim 1, further comprising projecting a production characteristic based at least in part on the determined composition using a well performance model.

3. The method of claim 2, further comprising building the well performance model based at least in part on the determined flow rate data.

4. The method of claim 2, wherein projecting the production characteristic includes projecting a change in flow rate of the at least one phase.

5. The method of claim 2, wherein projecting the production characteristic includes projecting a change in flow rate of the at least one phase in response to a well treatment.

6. The method of claim 5, wherein the well treatment includes fracking.

7. The method of claim 5, wherein the well treatment includes reworking.

8. The method of claim 2, wherein the down well video data includes video image data from a first position within the well and video image data from a second position within the well.

9. The method of claim 8, wherein projecting the production characteristic includes projecting a change in flow rate data in response to treating the well.

10. The method of claim 1, wherein the composition includes an average ratio of a hydrocarbon phase relative to one or more other phases of the multiphase flow.

11. The method of claim 1, wherein the composition includes an average volume percent flow.

12. The method of claim 1, further comprising aggregating compositions from a number of wells and building a field model.

13. The method of claim 12, further comprising projecting a field production characteristic based at least on the field model and the aggregated flow rate data.

14. A non-transitory computer readable storage medium comprising instructions operable by a processor to implement a method of projection a production characteristic, the method comprising:
receiving down well video data depicting multiphase flow within a well;
determine cross-sectional areas associated with a phase of the multiphase flow within frames of the down well video data; and
determining a composition of the multiphase flow based on the determined cross-sectional areas;
wherein the frames are selected periodically from the down well video data.

15. The storage medium of claim 14, wherein the method further comprises projecting the production characteristic based at least in part on the determined composition using a well performance model.

16. The storage medium of claim 14, wherein the method further comprises building the well performance model based at least in part on the determined flow rate data.

* * * * *